(12) United States Patent
Shao et al.

(10) Patent No.: US 12,469,763 B2
(45) Date of Patent: Nov. 11, 2025

(54) PACKAGE WITH IMPROVED HEAT DISSIPATION EFFICIENCY AND METHOD FOR FORMING THE SAME

(71) Applicant: Taiwan Semiconductor Manufacturing Co., Ltd., Hsinchu (TW)

(72) Inventors: Tung-Liang Shao, Hsinchu (TW); Yu-Sheng Huang, Hemei Township (TW); Kuo Yang Wu, Taoyuan (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 552 days.

(21) Appl. No.: 17/891,218

(22) Filed: Aug. 19, 2022

(65) Prior Publication Data
US 2024/0063079 A1 Feb. 22, 2024

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 23/3677* (2013.01); *H01L 23/3735* (2013.01); *H01L 23/44* (2013.01); *H01L 23/49816* (2013.01); *H01L 23/49822* (2013.01); *H01L 23/49833* (2013.01); *H01L 23/49838* (2013.01); *H01L 24/08* (2013.01); *H01L 24/16* (2013.01); *H01L 24/29* (2013.01); *H01L 24/32* (2013.01); *H01L 24/73* (2013.01); *H01L 25/0655* (2013.01); *H01L 2224/08235* (2013.01); *H01L 2224/16225* (2013.01); (Continued)

(58) Field of Classification Search
CPC ............ H01L 23/3675; H01L 21/4882; H01L 23/3677; H01L 23/3735; H01L 23/44; H01L 23/49816; H01L 23/49822; H01L 23/49833; H01L 23/49838; H01L 24/08; H01L 24/16; H01L 24/29; H01L 24/32; H01L 24/73; H01L 25/0655; H01L 2224/08235; H01L 2224/16225; H01L 2224/29187; H01L 2224/32225; H01L 2224/32245; H01L 2224/73204; H01L 2224/73253; H01L 2924/16196; H01L 2924/16235; H01L 2924/1632; H01L 2924/16587; H01L 2924/182; H01L 2924/3511
See application file for complete search history.

(56) References Cited

U.S. PATENT DOCUMENTS

2005/0258536 A1* 11/2005 Lin ...................... H01L 23/3735 257/E21.511
2017/0098598 A1* 4/2017 Otremba ............. H01L 23/3107
(Continued)

*Primary Examiner* — Fernando L Toledo
*Assistant Examiner* — Neil R Prasad
(74) *Attorney, Agent, or Firm* — Slater Matsil, LLP

(57) ABSTRACT

In an embodiment, a package is provided. The package includes a semiconductor device; an encapsulant laterally surrounding the semiconductor device; and a heat dissipation structure disposed over the semiconductor device and the encapsulant, wherein the heat dissipation structure includes a plurality of pillars and a porous layer extending over sidewalls of the plurality of pillars.

20 Claims, 29 Drawing Sheets

(51) Int. Cl.
*H01L 23/00* (2006.01)
*H01L 23/373* (2006.01)
*H01L 23/44* (2006.01)
*H01L 23/498* (2006.01)
*H01L 25/065* (2023.01)

(52) U.S. Cl.
CPC .............. *H01L 2224/29187* (2013.01); *H01L 2224/32225* (2013.01); *H01L 2224/32245* (2013.01); *H01L 2224/73204* (2013.01); *H01L 2224/73253* (2013.01); *H01L 2924/16196* (2013.01); *H01L 2924/16235* (2013.01); *H01L 2924/1632* (2013.01); *H01L 2924/16587* (2013.01); *H01L 2924/182* (2013.01); *H01L 2924/3511* (2013.01)

(56) References Cited

U.S. PATENT DOCUMENTS

| | | | |
|---|---|---|---|
| 2021/0249325 A1* | 8/2021 | Rae | H01L 23/4334 |
| 2022/0359338 A1* | 11/2022 | Moreira | H01L 24/16 |
| 2023/0180434 A1* | 6/2023 | Shia | H05K 7/20381 |
| | | | 361/700 |

* cited by examiner

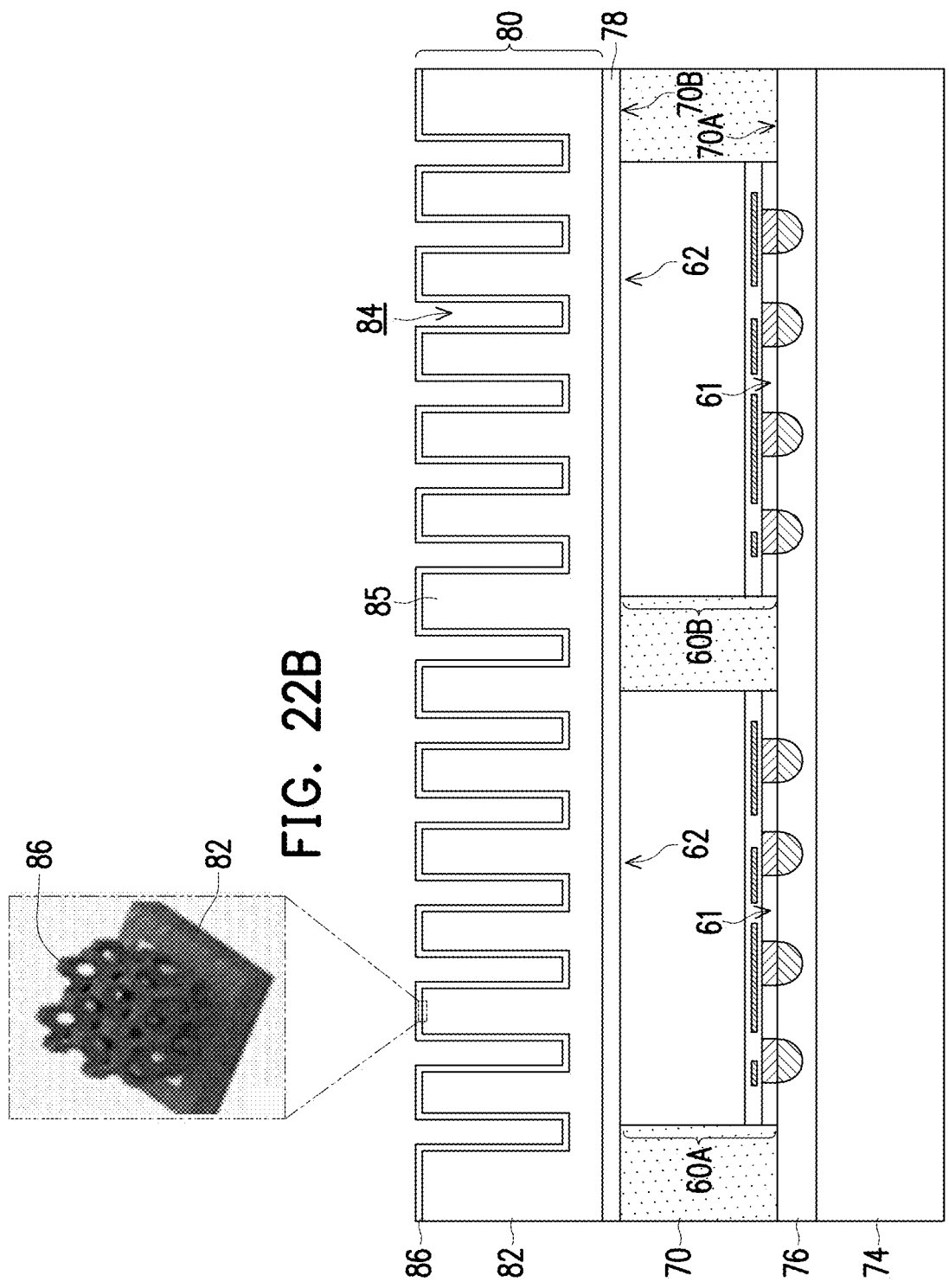

PACKAGE WITH IMPROVED HEAT DISSIPATION EFFICIENCY AND METHOD FOR FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tendency for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18, 19, 20A, 21A, and 22A are cross-sectional views of intermediate stages in the manufacturing of a heat dissipation structure, in accordance with some embodiments.

FIGS. 20B, 21B, and 22B are enlarged views of a polymer layer or a porous layer of a heat dissipation structure, in accordance with some embodiments.

DETAILED DESCRIPTION

Figure 1:
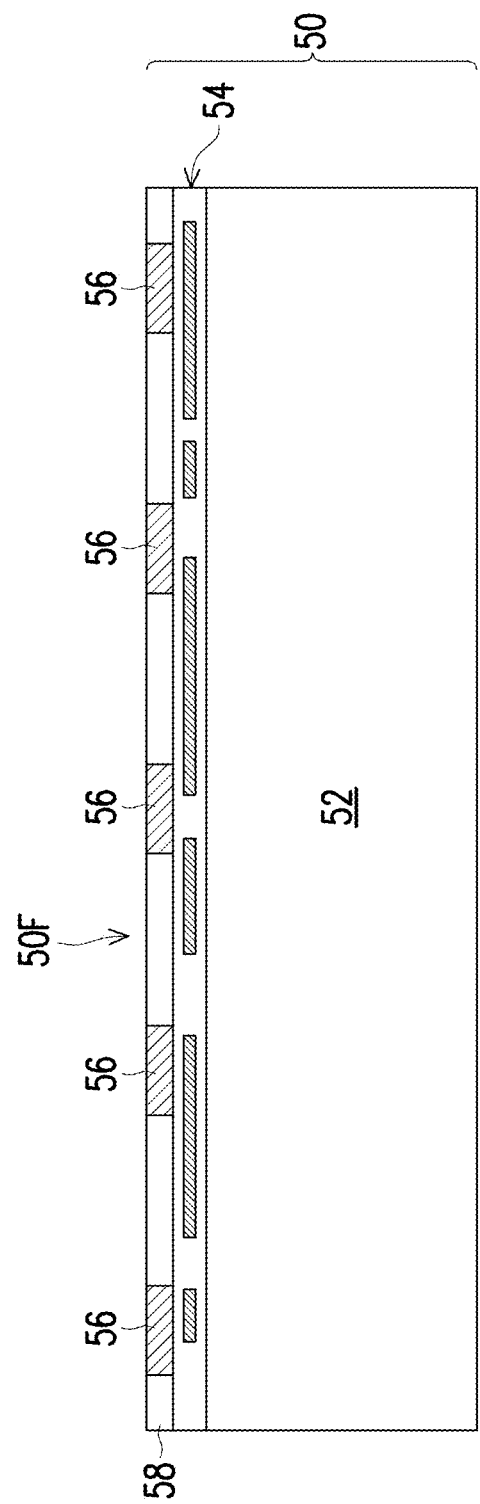
FIG. 1 is a cross-sectional view of an integrated circuit die, in accordance with some embodiments.
Figure 2:
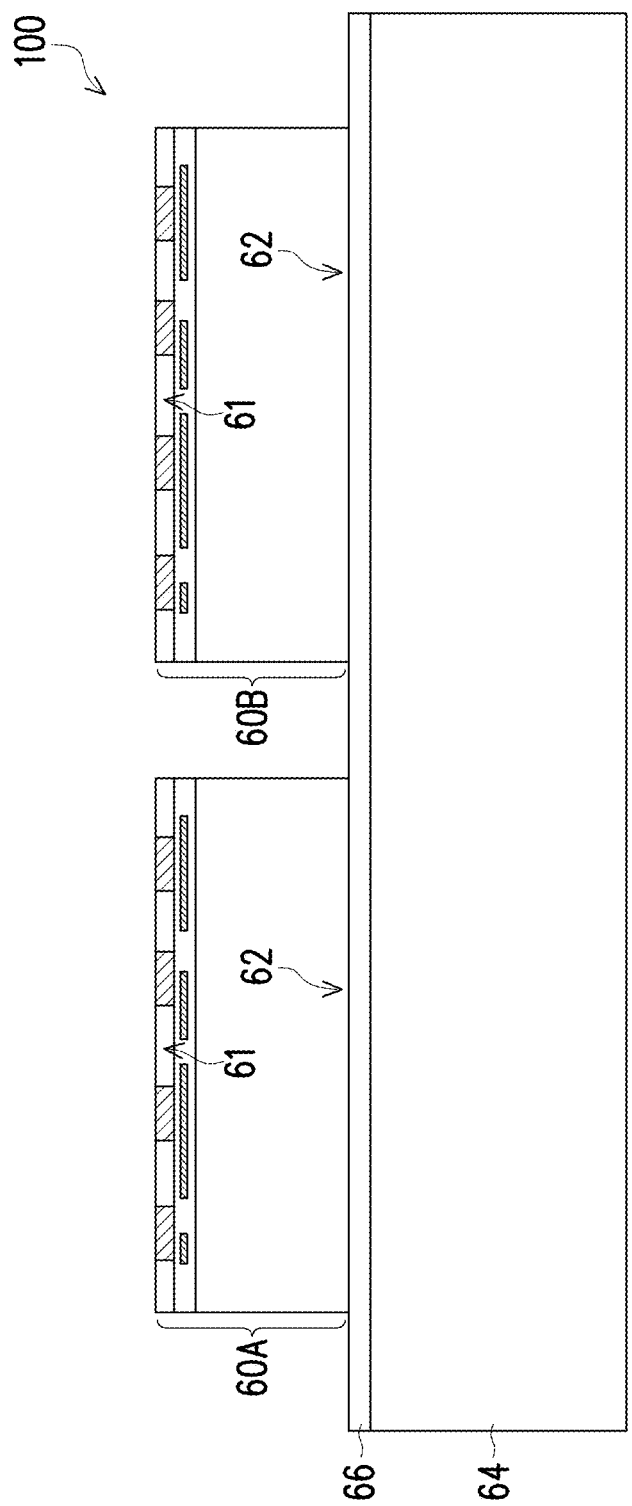
FIGS. 2-8, 9A, and 10-12 are cross-sectional views of intermediate stages in the manufacturing of a semiconductor package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a semiconductor package with improved heat dissipation efficiency and capacity is provided in accordance with some embodiments. In some embodiments, the semiconductor package includes a heat dissipation structure disposed over a semiconductor device and an encapsulant around the semiconductor device. The heat dissipation structure includes a porous layer for providing a high surface area for increasing heat dissipation efficiency. The semiconductor package may be also designed to be operated in a cooling fluid.

FIG. 1 is a cross-sectional view of an integrated circuit die 50. One or more integrated circuit dies 50 will be packaged in subsequent processing to form integrated circuit packages. Each integrated circuit die 50 may be a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), an application-specific integrated circuit (ASIC) die, the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58 (if present).

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active side (e.g., the surface facing upward in FIG. 1) and an inactive side (e.g., the surface facing downward in FIG. 1). Devices are at the active side of the semiconductor substrate 52. The devices may be active devices (e.g., transistors, diodes, etc.), capacitors, resistors, etc. The inactive side may be free from devices.

The interconnect structure 54 is on the active side of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The metallization layer(s) may include conductive vias and/or conductive lines to interconnect the devices of the semiconductor substrate 52. The metallization layer(s) may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be pads, conductive pillars, conductive pillars on pads, or the like to which external connections are made. The die connectors 56 are in and/or on the interconnect structure 54. For example, the die connectors 56 may include at least a part being an upper metallization layer of the interconnect structure 54. The die connectors 56 can be formed of a metal, such as copper, aluminum, or the like, and can be formed by, for example, plating, or the like.

A dielectric layer 58 is optionally disposed at the front side 50F of the integrated circuit die 50. The dielectric layer 58 (if present) is in and/or on the interconnect structure 54. For example, the dielectric layer 58 may be an upper dielectric layer of the interconnect structure 54 and encapsulate at least a portion of the die connectors 56. In some embodiments, the dielectric layer 58 is an oxide, a nitride, a carbide, a polymer, the like, or a combination thereof. The dielectric layer 58 may be formed, for example, by spin coating, lamination, chemical vapor deposition (CVD), or the like.

The die connectors 56 may protrude over, coplanar with, or be covered by the dielectric layer 58 although only coplanar die connectors 56 and dielectric layer 48 are shown in FIG. 1. The die connectors 56 may be formed after the dielectric layer 58. For example, openings for the die connectors 56 may be formed in the dielectric layer 58, and the die connectors 56 are formed in the openings and on the dielectric layer 58. Alternatively, the die connectors 56 may be formed first, and the dielectric layer 58 is formed later for encapsulating the die connectors 56. In such embodiments, the dielectric layer 58 may have a top surface above the top surfaces of the die connectors 56. In some embodiments that the die connectors 56 are exposed through the dielectric layer 58 by a removal process, such as a chemical mechanical polish (CMP), a mechanical grinding, an etch-back, combinations thereof, or the like, although the removal process may be omitted in the formation of the integrated circuit die 50 and be performed in the manufacturing of a semiconductor package.

FIGS. 2 to 11 are cross-sectional views of intermediate stages in the manufacturing of a semiconductor package 100 in accordance with some embodiments. The semiconductor package 100 may be a flip-chip package, which may include one or more semiconductor devices attached to a substrate using conductive connectors. In some embodiments, a heat dissipation structure is formed over or attached to inactive sides of the semiconductor devices to provide the semiconductor package 100 with improved heat dissipation efficiency and capacity.

The manufacturing of a semiconductor package 100 includes attaching one or more semiconductor devices to a carrier substrate 64 or other suitable support structure for subsequent processing in accordance with some embodiments. For example, in FIG. 2, semiconductor devices 60A and 60B are placed on the carrier substrate 64, though any quantities of the semiconductor devices 60A and 60B may be used. In some embodiments, the active sides 61 of the semiconductor devices 60A and 60B are facing away from the carrier substrate 64, and the inactive sides 62 of the semiconductor devices 60A and 60B are facing the carrier substrate 64. In some embodiments, the semiconductor devices 60A and 60B may be the integrated circuit die 50 described in FIG. 1, a stack of the integrated circuit dies 50, or a package including the integrated circuit die 50. In some embodiments, the semiconductor devices 60A and 60B are similar to each other. Alternatively, the semiconductor device 60A may have a different function from the semiconductor device 60B. For example, the semiconductor device 60A may be a logic device, such as a central processing unit (CPU), graphics processing unit (GPU), system-on-a-chip (SoC), microcontroller, application-specific integrated circuit (ASIC) or the like, and the semiconductor device 60B may be a memory device, such as a dynamic random-access memory (DRAM) device, static random-access memory (SRAM) device, hybrid memory cube (HMC) module, a high bandwidth memory (HBM) module, or the like. The semiconductor devices 60A and 60B may be formed in processes of a same technology node, or may be formed in processes of different technology nodes. For example, the semiconductor device 60A may be of a more advanced process node than the semiconductor device 60B. In some embodiments, the semiconductor devices 60A and 60B have different sizes, such as different heights and/or bottom areas.

The semiconductor devices 60A and 60B are attached to the carrier substrate 64 by a release layer 66 in accordance with some embodiments. The carrier substrate 64 may be a bulk semiconductor substrate or a glass substrate in a wafer shape, a panel shape, or the like. The release layer 66 may be formed of a polymer-based material, which may be removed along with the carrier substrate 64 from the structure after processing. In some embodiments, the release layer 66 is an epoxy-based thermal-release material, which loses its adhesive property when heated, such as a light-to-heat-conversion (LTHC) release coating.

Figure 3:
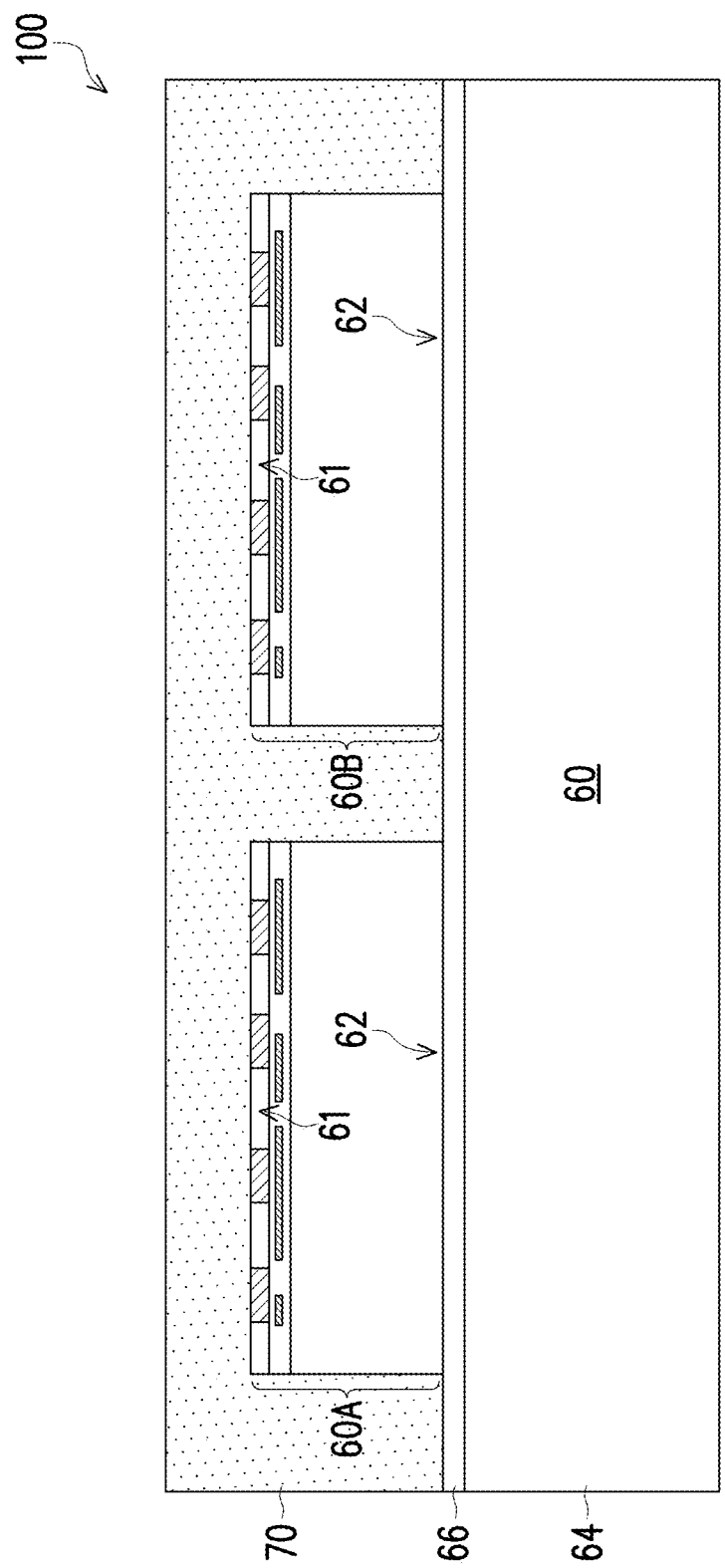

In FIG. 3, an encapsulant 70 is formed over the carrier substrate 64 and over the semiconductor devices 60A and 60B in accordance with some embodiments. For example, active sides 61 of the semiconductor devices 60A and 60B may be buried or covered by the encapsulant 70. The encapsulant 70 may be a molding compound, which may include a polymer base material, such as a resin, an epoxy, or the like, and filler particles in the polymer base material. The filler particles may be dielectric particles of $SiO_2$, $Al_2O_3$, or the like, and may have spherical shapes. Also, the filler particles may have a plurality of different diameters. The encapsulant 70 may be applied in liquid or semi-liquid form and then subsequently cured, such as being applied by compression molding, transfer molding, or the like.

Figure 4:
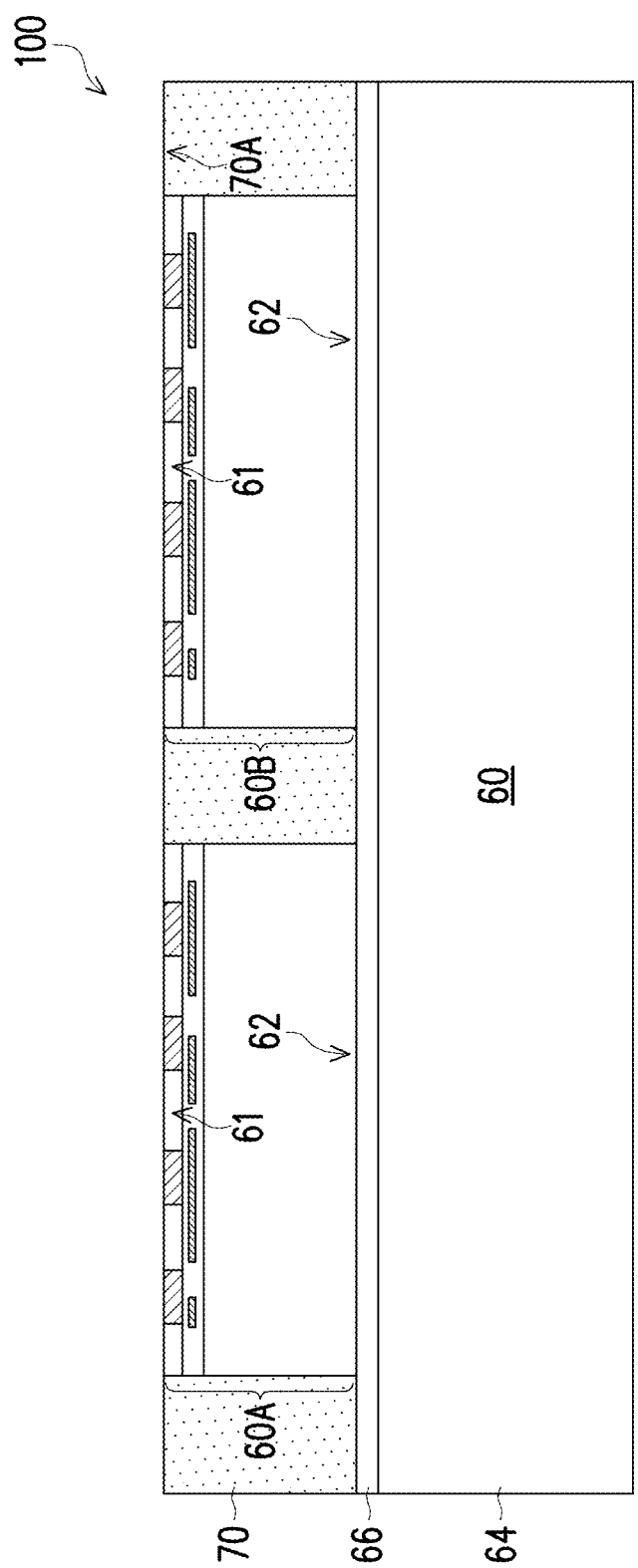

In FIG. 4, the encapsulant 70 is thinned to expose the semiconductor devices 60A and 60B in accordance with some embodiments. For example, the thinning removes portions of the encapsulant 70 covering the top surfaces of the semiconductor devices 60A and 60B. In some embodiments, the thinning also removes portions of the semiconductor devices 60A and/or 60B. After the thinning, the active sides 61 (e.g., top surfaces) of the semiconductor devices 60A and 60B may be coplanar (with process variations) with each other as well as coplanar (with process variations) with a first side 70A (e.g., top surface) of the encapsulant 70. The thinning process may be a mechanical grinding, a chemical-mechanical polish (CMP), an etch-back, a combination thereof, or the like.

Figure 5:
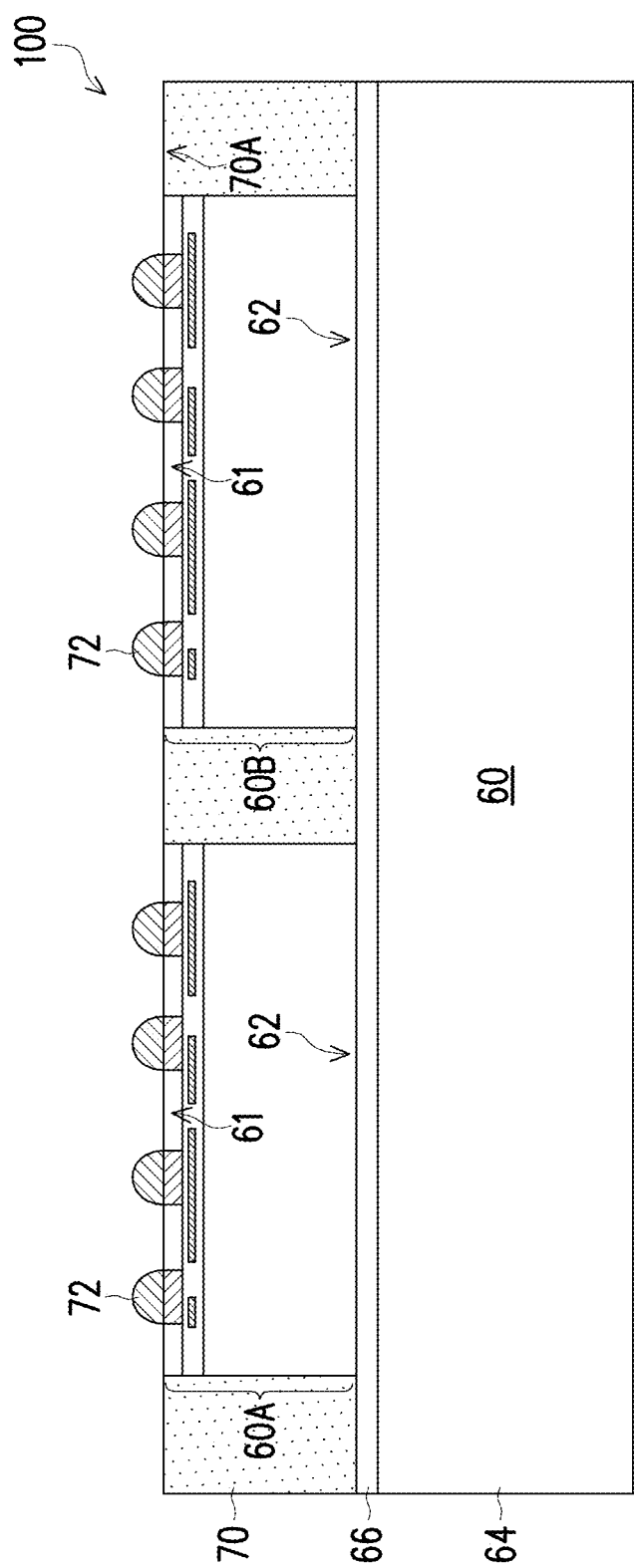

In FIG. 5, conductive connectors 72 are formed over the active sides 61 of the semiconductor devices 60A and 60B, such as over the die connectors 56. The conductive connectors 72 may be controlled collapse chip connection (C4) bumps, micro bumps, electroless nickel-electroless palladium-immersion gold technique (ENEPIG) formed bumps, metal pillars, or the like. The conductive connectors 72 may include a conductive material that is reflowable, such as solder, and may also include copper, aluminum, gold, nickel, silver, palladium, tin, lead, the like, or combinations thereof. In some embodiments, the conductive connectors 72 are formed by initially forming a layer of solder through evaporation, electroplating, printing, solder transfer, ball placement, or the like. Once a layer of solder has been formed on the structure, a reflow may be performed in order to shape the material into desired bump shapes.

Figure 6:
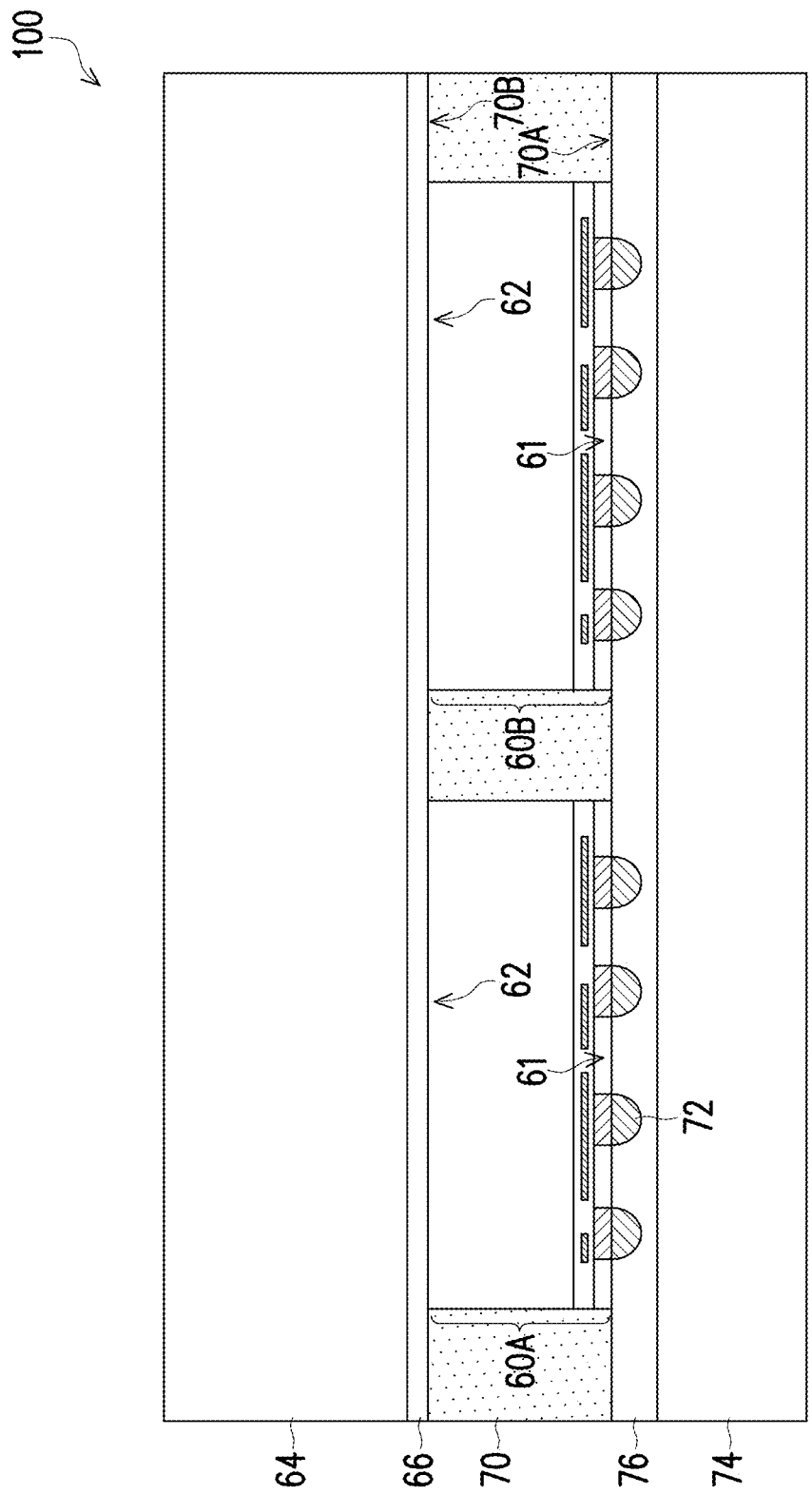

In FIG. 6, the intermediate structure may be placed on a carrier substrate 74 or other suitable support structure for subsequent processing. For example, the active sides 61 of the semiconductor devices 60A and 60B and the first side 70A of the encapsulant 70 may be attached to the carrier substrate 74 by a release layer 76. In some embodiments, the release layer 76 has a thickness greater than the conductive connectors 72 for avoiding the conductive connectors 72 from touching the carrier substrate 74, which may prevent or reduce damage to the conductive connectors 72. In some embodiments, the carrier substrate 74 is a bulk semiconductor substrate or a glass substrate in a wafer shape, a panel shape, or the like. The release layer 76 may have a similar material as the release layer 66, such as a thermal-release material, which may lose its adhesive property when heated, such as LTHC release coating.

Figure 7:
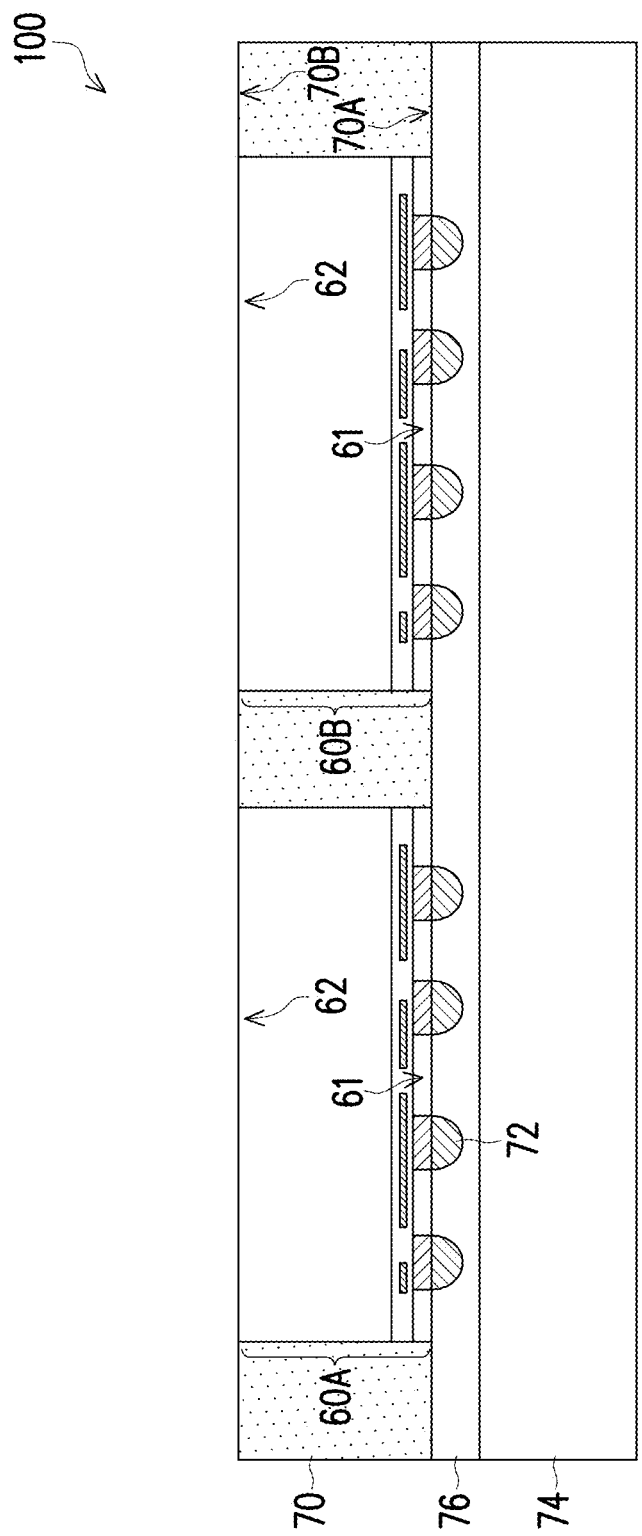

In FIG. 7, a carrier debonding is performed to detach (debond) the carrier substrate 64 (see FIG. 6) from the inactive side 62 of the semiconductor devices 60A and 60B and a second side 70B of the encapsulant 70. The debonding includes projecting a light such as a laser light or an ultraviolet (UV) light from a top side of the carrier substrate 64 for heating the release layer 66 locally. Accordingly, the release layer 66 may be decomposed under the locally distributed heat of the light, and the carrier substrate 64 can be removed, while the release layer 76 over the second side 70B of the encapsulant 70 may not be affected.

Figure 8:
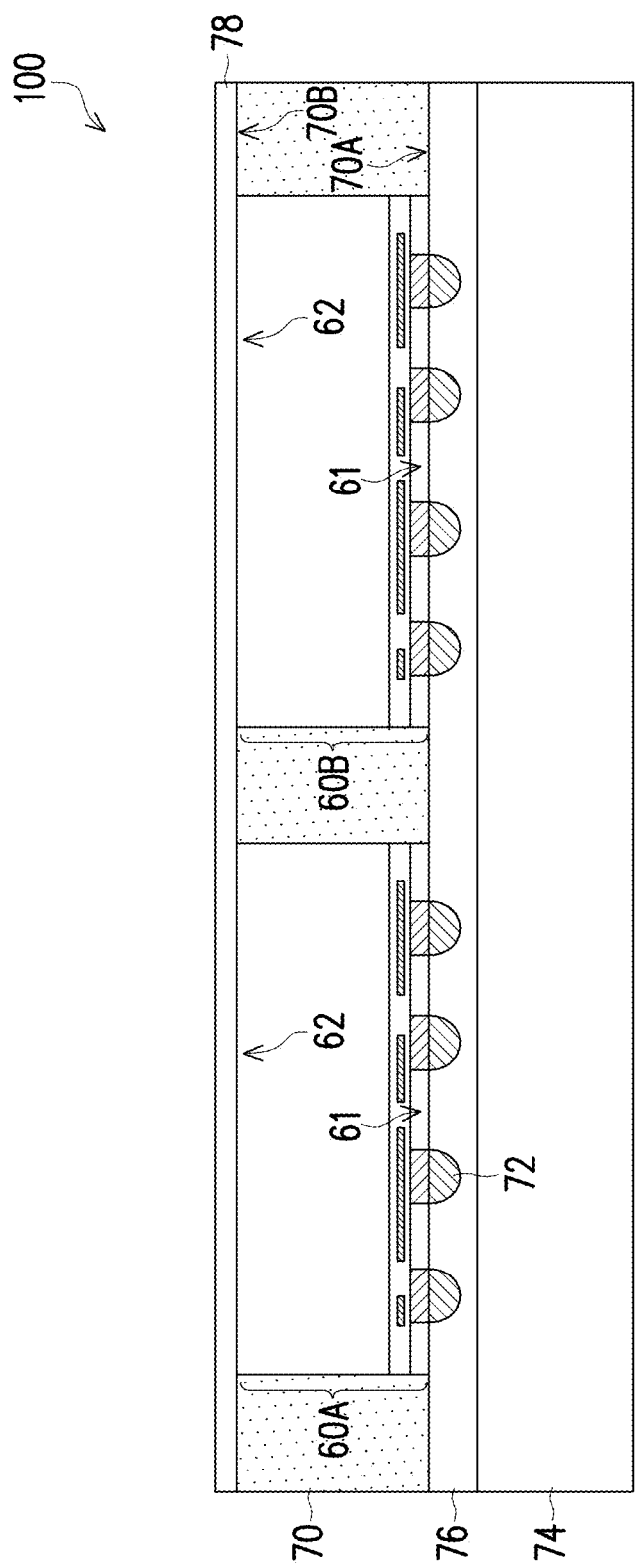

In FIG. 8, a bonding film 78 is provided or formed over the inactive sides 62 of the semiconductor devices 60A and 60B and the second side 70B of the encapsulant 70 in accordance with some embodiments. The bonding film 78 may be an adhesive layer for providing adhesive characteristics or an oxide layer (e.g., silicon oxide) for providing an oxide interface capable of forming a fusion bond. In some embodiments in which the bonding film is the adhesive layer, the bonding film 78 includes a thermal interface material (TIM). The TIM may be a polymeric material, solder paste, indium solder paste, or the like. In some embodiments in which the bonding film 78 is the oxide layer, the oxide layer includes silicon oxide, silicon oxynitride, other oxides that are capable of forming fusion bonding, or a combination thereof. In some embodiments, the oxide layer is formed by CVD, physical vapor deposition (PVD), spin coating, or the like.

Figure 9A:
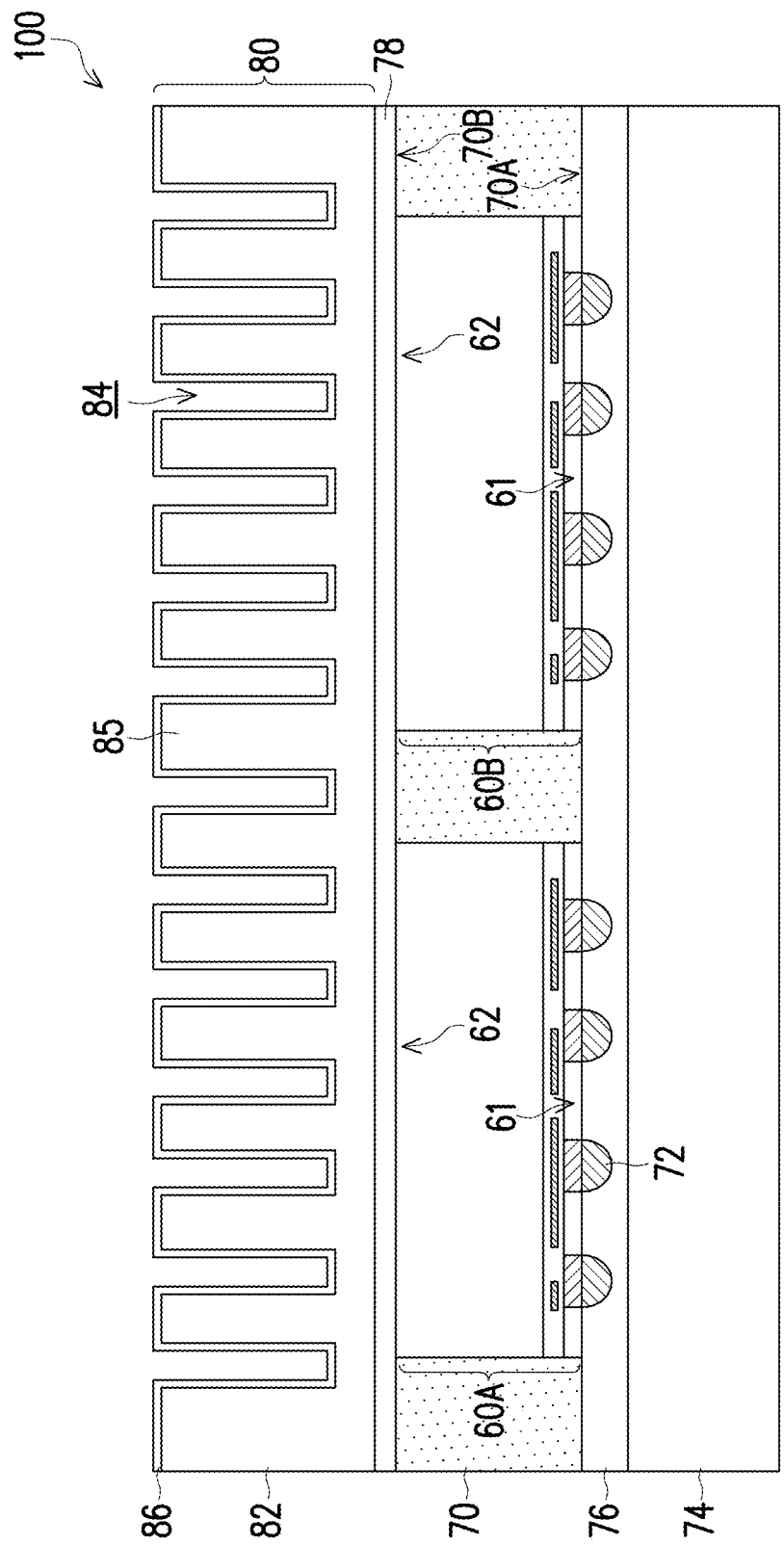
Figure 9B:
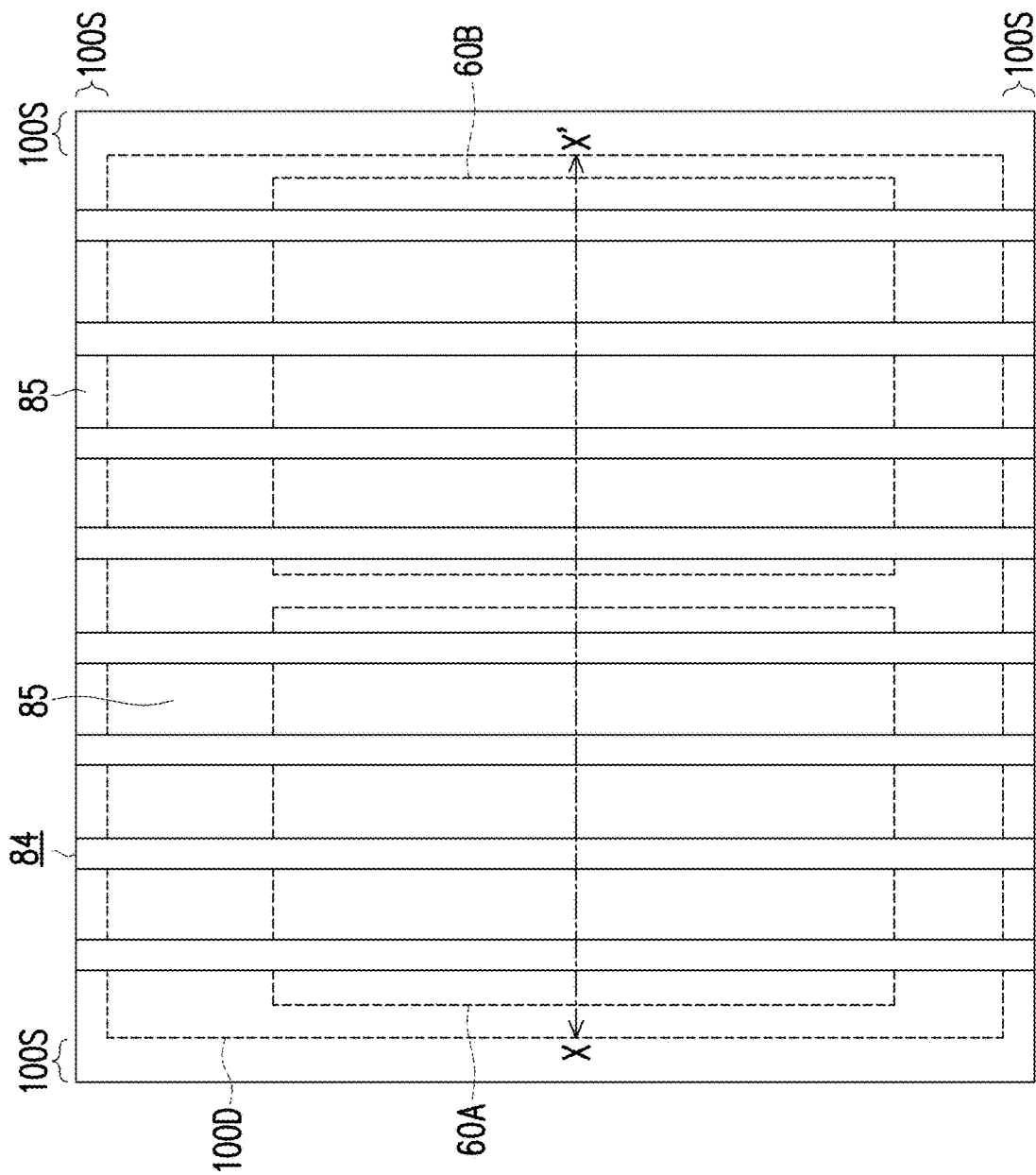
FIGS. 9B and 9C are plan views of intermediate stages in the manufacturing of a semiconductor package, in accordance with some embodiments.
Figure 9C:
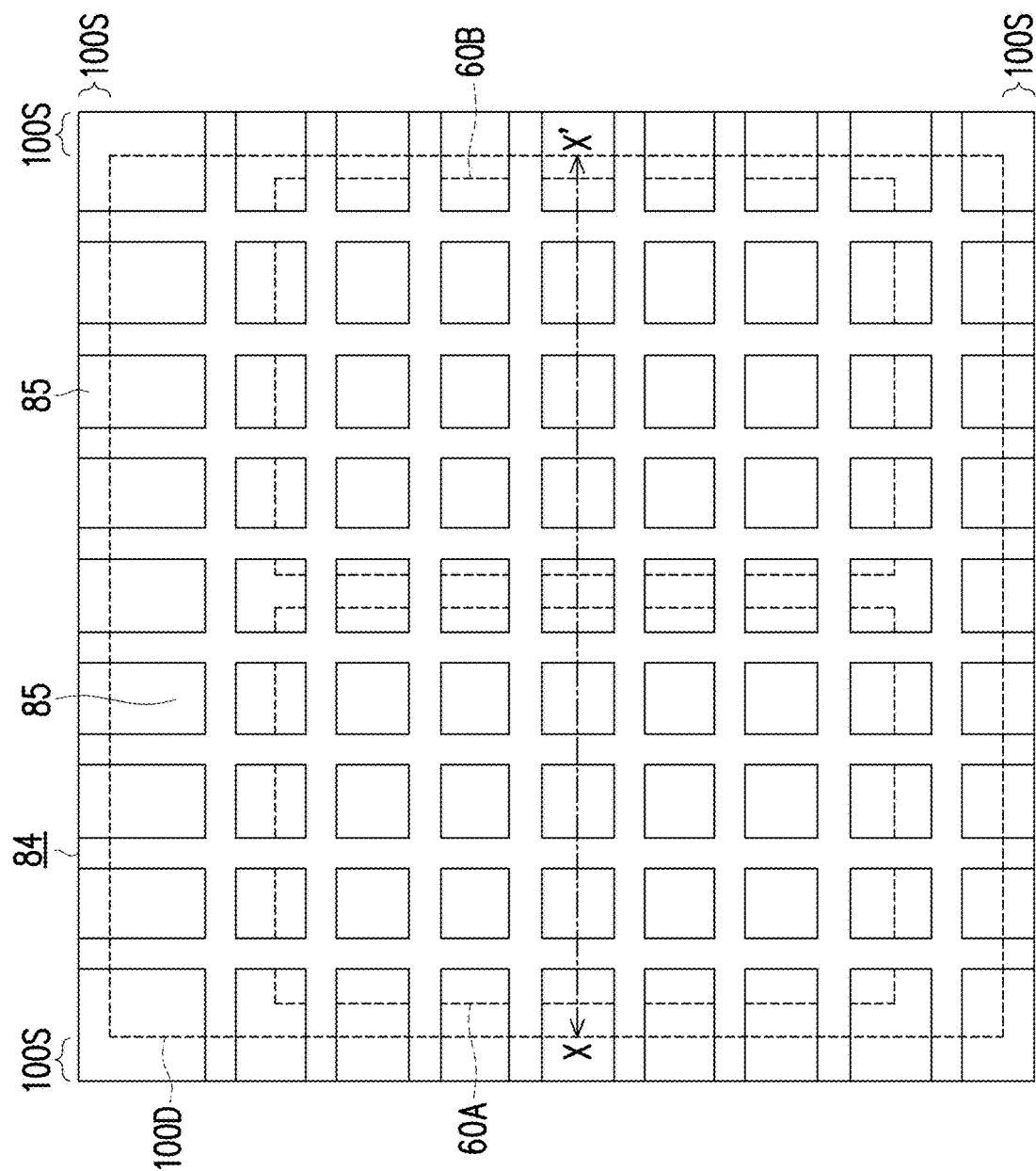

FIGS. 9A to 9C illustrate a heat dissipation structure 80 is provided or formed over the bonding film 78 in accordance with some embodiments. FIGS. 9B and 9C illustrate top views of an intermediate stage of a device region 100D and a scribe region 100S of the semiconductor package 100, wherein FIG. 9B illustrates an example in which the heat dissipation structure 80 comprises a plurality of trenches 84 in a parallel orientation (porous layer 86 not shown), and FIG. 9C illustrates an example in which the heat dissipation structure 80 comprises a plurality of trenches 84 arranged in a grid pattern (porous layer 86 not shown). FIG. 9A illustrates a cross-sectional view along the section X-X' illustrated in FIG. 9B or FIG. 9C.

The heat dissipation structure 80 may include a substrate 82 having a plurality of trenches 84 and pillars 85, and a porous layer 86 extending along the top surface of the substrate 82 and into the trenches 84 (e.g., extending over the pillars 85). The manufacturing processes of the heat dissipation structure 80 will be discussed in detail in FIGS. 18 to 22B.

In some embodiments, the substrate 82 is formed of a metal material, such as Cu, Al, Ni, Co, Ti, W, an alloy thereof, graphite, graphene, a combination thereof, or a like. In some embodiments, the substrate 82 is formed of a semiconductor material, such as silicon or a semiconductor material similar to those described for the semiconductor substrate 52 illustrated in FIG. 1. The trenches 84 may have any shapes, and may have a regular or irregular pattern. For example, FIG. 9B illustrates an exemplary pattern of the trenches 84 in the device region 100D, the device region 100D being surrounded by the scribe region 100S. The trenches 84 may have a strip-like shape and extend along a first direction (e.g., the vertical direction in FIG. 9B). In some embodiments, the trenches 84 may have a strip-like shape and be arranged as a grid pattern as illustrated in FIG. 9C, where some of the trenches 84A extend along a first direction (e.g., the vertical direction in FIG. 9C), and some of the trenches 84 extend along a second direction (e.g., the horizontal directions in FIG. 9C). In some embodiments, the trenches 84 extends through the substrate 82 and exposes the bonding film 78, although the trenches 84 illustrated in FIG. 9A only partially extends through the substrate 82.

The porous layer 86 is formed over the substrate 82 of the heat dissipation structure 80, such as extending along a top surface of the substrate 82 and surfaces of the trenches 84 (e.g., over the pillars 85). An example method of forming the porous layer 86 is provided below with reference to FIGS. 18-21B. The porous layer 86 may include Cu, Al, Ni, Co, Ti, W, Si, or a combination thereof. In some embodiments, the porous layer 86 is formed of a same material as the substrate 82. The porous layer 86 may have a thickness of about 5 μm to about 50 μm, such as about 10 μm, and in some embodiments the porous layer 86 may be conformal. The porous layer 86 has an average pore size of 0.1 μm to 5 μm in accordance with some embodiments. In some embodiments, the porous layer 86 has a surface area of 2244 mm$^2$ to 22242 mm$^2$, which may be 2.6 times to 26.2 times greater than the surface area of the substrate 82 that has the trenches 84 but does not have the porous layer 86.

Figure 10:
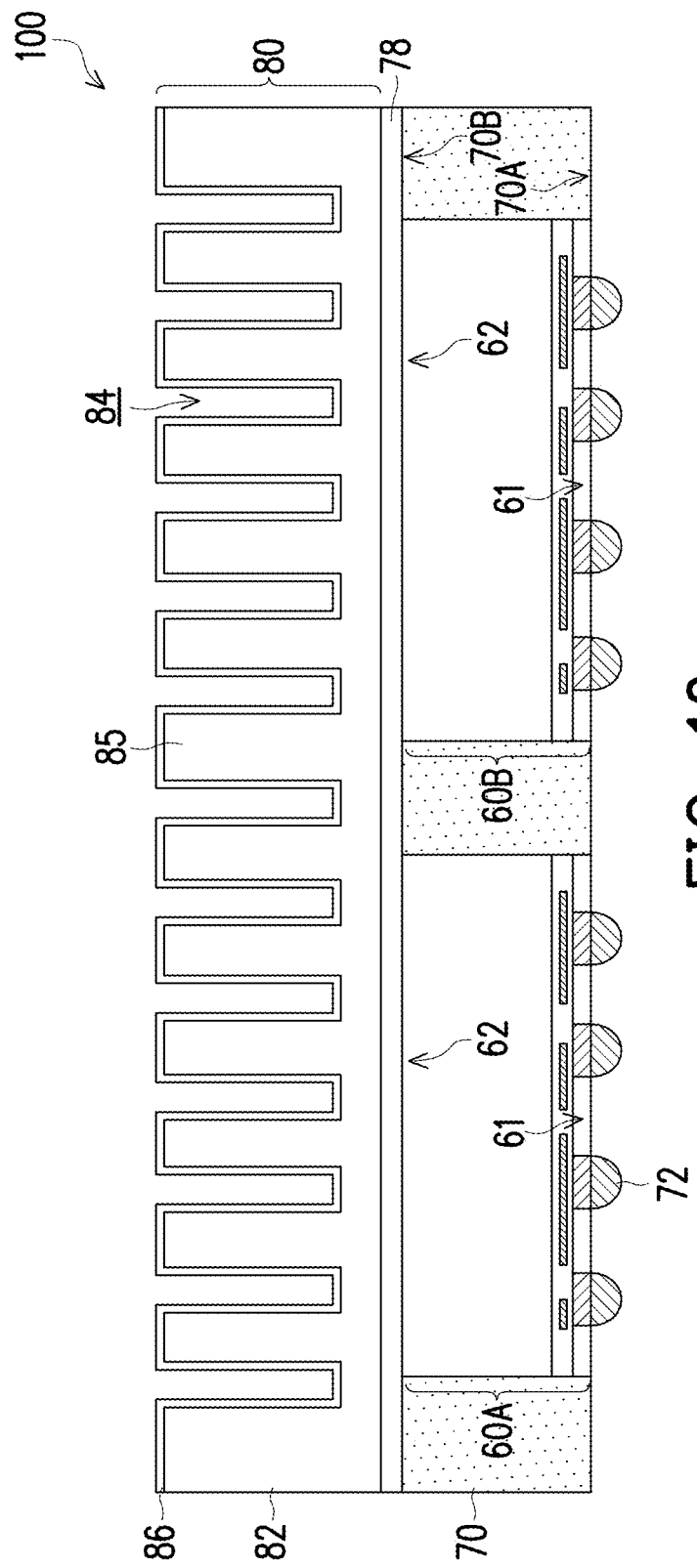

In FIG. 10, a carrier debonding is performed to detach (debond) the carrier substrate 74 (see FIG. 8) from the conductive connectors 72 and the first side 70A of the encapsulant 70. In embodiments in which the release layer 76 comprises an LTHC material, the debonding includes projecting a light such as a laser light or an ultraviolet (UV) light from a top side of the carrier substrate 74 for heating the release layer 76. Accordingly, the release layer 76 may be decomposed under the heat of the light, and the carrier substrate 74 can be removed.

Figure 11:
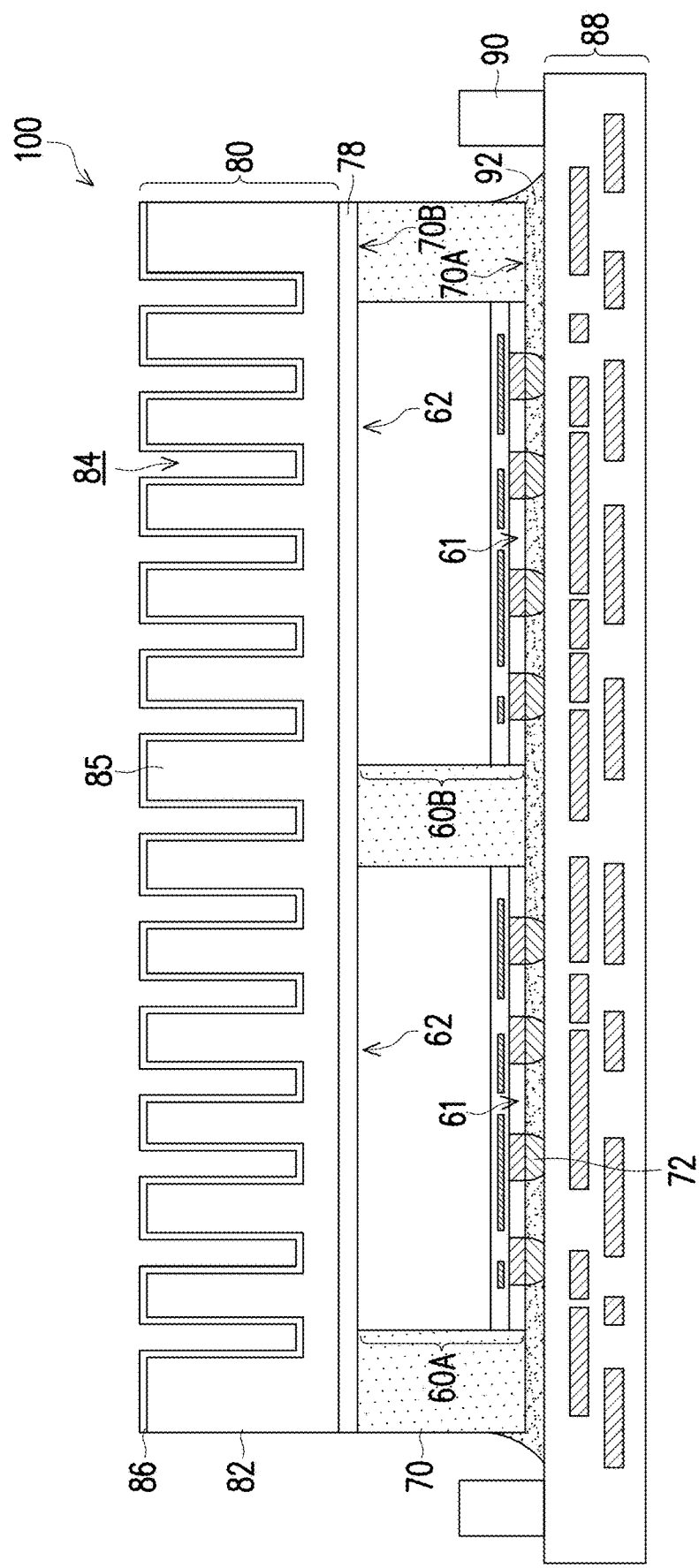

Next, referring to FIG. 11, the intermediate structure is attached to a substrate 88 using the conductive connectors 72 in accordance with some embodiments. It is noted that the processes discussed in FIGS. 1-10 may be performed at the wafer level, wherein the encapsulant 70 is wafer-sized. Thus, a singulation process may be performed to singulate the wafer-sized package into separate packages (e.g., one separated package structure is illustrated in FIG. 11) along the scribe region 100S (see FIG. 9B or 9C). The substrate 88 may include active and/or passive devices (not separately illustrated). Devices such as transistors, capacitors, resistors, combinations thereof, and the like may be used to generate the structural and functional requirements of the design for the system. In some embodiments that the substrate 88 is an interposer, the substrate 88 may include an interconnection layer on a semiconductor substrate (e.g., silicon) and through vias that may connect to metallization patterns of the interconnection layer and extend through the semiconductor substrate of the interposer.

The singulation process may include sawing, dicing, or the like. For example, the singulation process may include sawing the heat dissipation structure 80, the bonding film 78, and the encapsulant 70. As a result of the singulation process, the outer sidewalls of the heat dissipation structure 80 and the encapsulant 70 are laterally coterminous (within process variations). In some embodiments (not shown), the singulation process may be performed after the substrate 88 is attached. For example, the wafer-sized package structure may be attached to the substrate 88, and singulation process is then performed. In such embodiment, the singulation process includes sawing the substrate 88 together with the heat dissipation structure 80, the bonding film 78, and the encapsulant 70. As a result of the singulation process, the outer sidewalls of the heat dissipation structure 80, the bonding film 78, the encapsulant 70, and the substrate 88 are laterally coterminous (within process variations).

In some embodiments, a ring structure 90 is disposed over the substrate 88. The ring structure 90 may laterally surround the encapsulant 70. In some embodiments, the ring structure 90 may be made of a metal or a metal alloy, for example, aluminum, copper, nickel, cobalt, an alloy thereof, or a combination thereof, or other materials, such as silicon carbide, aluminum nitride, graphite, and the like. The ring structure 90 may reduce the warpage of the substrate 88. The ring structure 90 may be attached to the substrate 88 using, for example, an adhesive layer (not shown).

In some embodiments, an underfill 92 is formed between the encapsulant 70 and the substrate 88, surrounding the conductive connectors. The underfill 92 may have linear or curved sidewalls. The underfill 92 may be formed of an underfill material such as an epoxy or the like. The underfill 92 may be formed by a capillary flow process after substrate 88 is attached or may be formed by a suitable deposition method before the substrate 88 is attached. The underfill 92 may be a continuous material extending from the substrate 88 to the encapsulant 70. The underfill 92 may be applied in liquid or semi-liquid form and then subsequently cured. The underfill 92 may provide protection to the conductive connectors 72 and prevent joints resulting from the reflowing of the conductive connectors 72.

Figure 12:
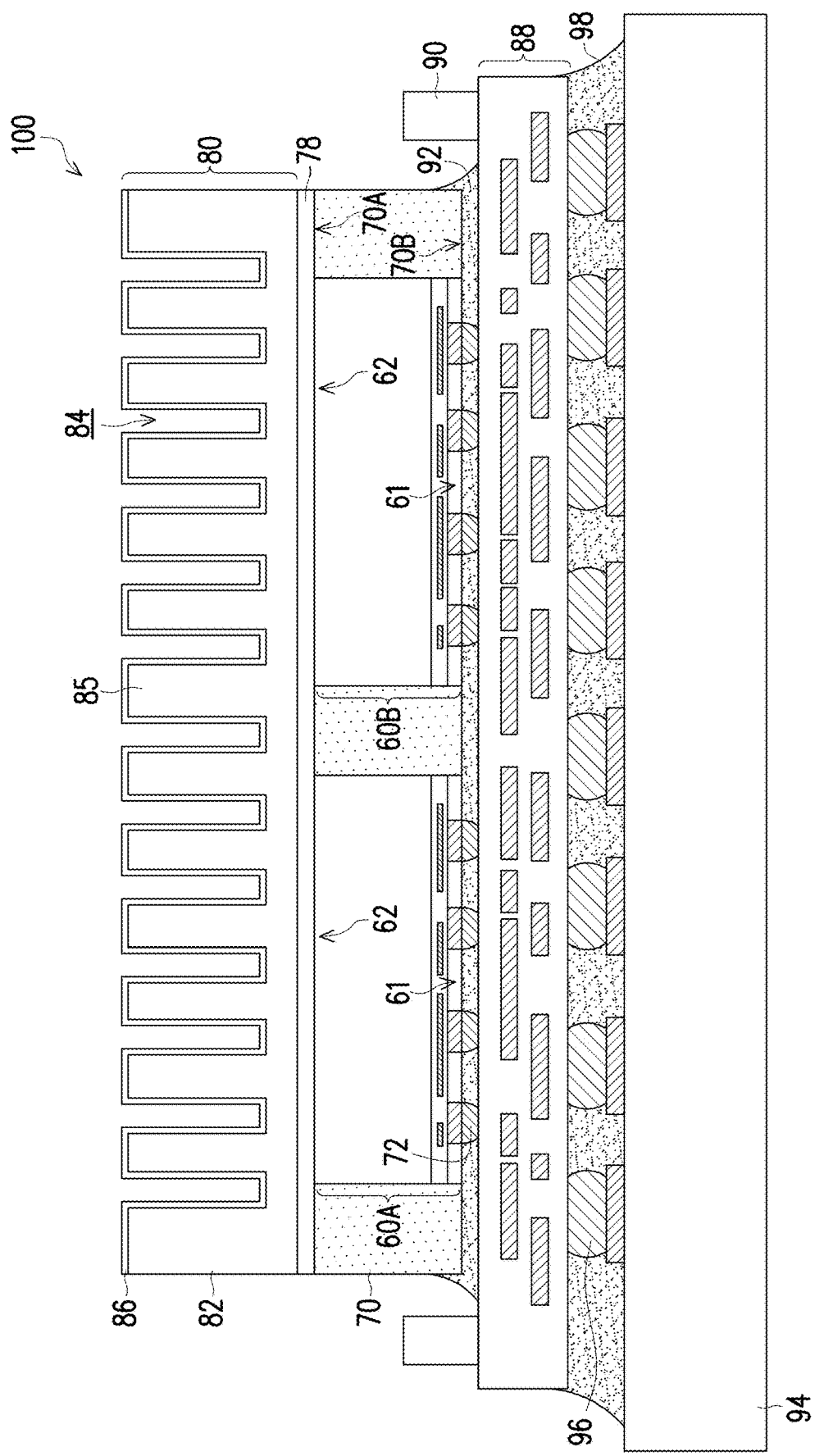

In FIG. 12, the substrate 88 is attached to a substrate 94 using conductive connectors 96 in accordance with some embodiments. The substrate 88 may be a PCB, or be a substrate similar to the substrate 88 and with a greater size. Conductive connectors 96 The conductive connectors 96 may be ball array bumps (BGA), or be connectors similar to the conductive connectors 72 and with a greater size. In some embodiments, an underfill 98 is formed between the substrate 88 and the substrate 94, surrounding the conductive connectors 96. The underfill 98 may have linear or curved sidewalls. The underfill 98 may be formed of a material similar to those of the underfill 92 and may be formed in a same manner as the those of the underfill 92.

The semiconductor package 100 may have improved heat dissipation efficiency and capacity by mounting the heat dissipation structure 80 over the inactive sides 62 of the semiconductor devices 60A and 60B. For example, the heat dissipation structure 80 may provide a larger surface area and allow a cooling gas or a cooling fluid to flow through for dissipating away heat generated from the semiconductor devices 60A and 60B. Specifically, the porous layer 86 may increase the surface area of the heat dissipation structure 80. Increasing the surface area of the heat dissipation structure 80 may allow more cooling gas or cooling fluid to effectively contact the heat dissipation structure 80 per unit time so that the heat transferring rate between the heat dissipation structure 80 and the cooling gas or cooling fluid may be improved. As a result, the dissipation capacity and efficiency of the semiconductor package 100 are enhanced, and the performance and reliability of the semiconductor package 100 may also be improved.

Figure 13:
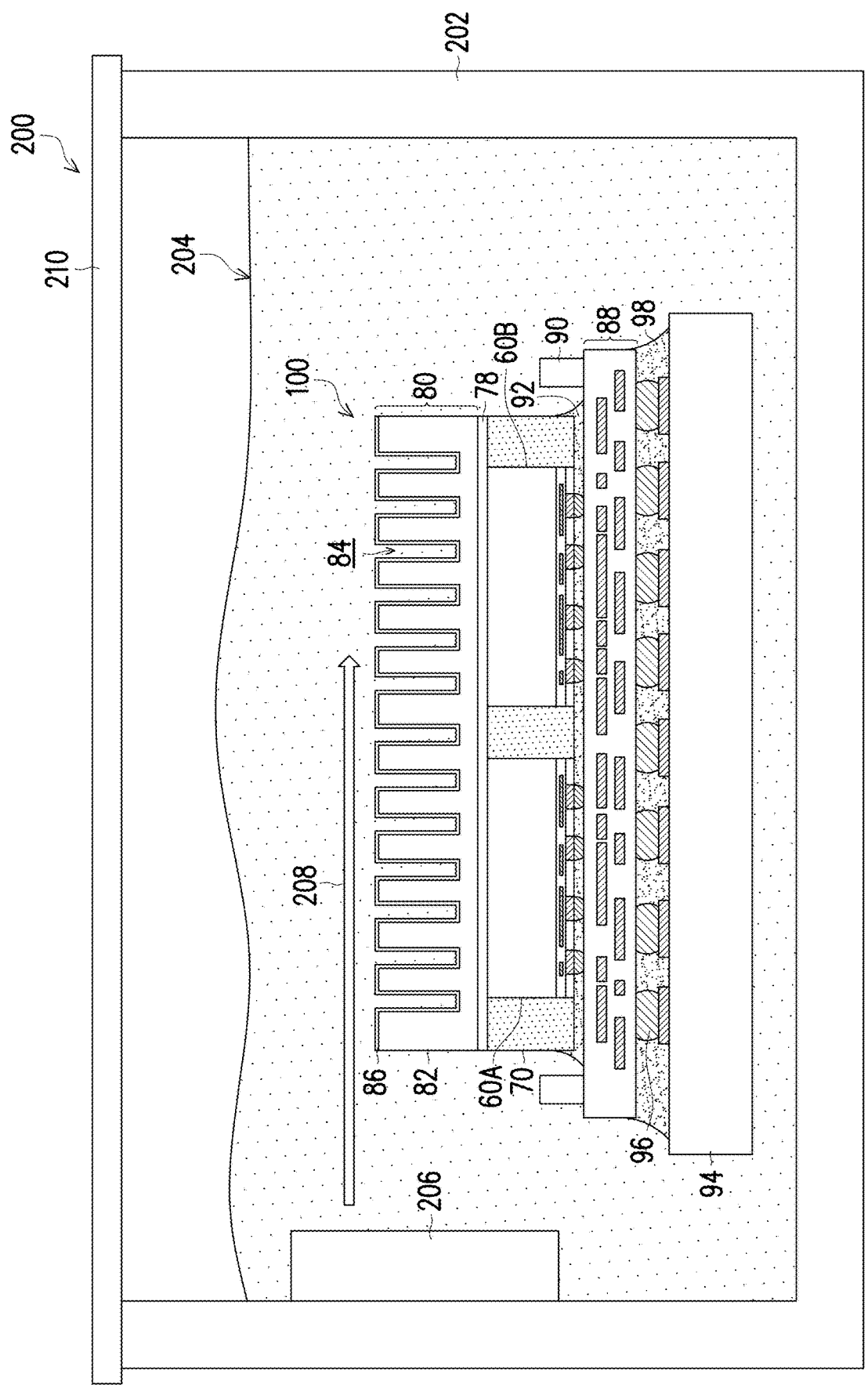
FIG. 13 is a cross-sectional view of a heat dissipation system, in accordance with some embodiments.

FIG. 13 illustrates an exemplary embodiment of the semiconductor package 100 being operated in a heat dissipation system 200. The heat dissipation system 200 may include a tank 202, which allows the semiconductor package 100 and cooling fluid 204 to be disposed therein. The cooling fluid 204 may include water, fluorocarbons, chlorocarbons, other suitable liquid coolants, or a combination thereof. In some embodiments, the cooling fluid 204 is contained in the tank 202, and the semiconductor package 100 is immersed in the cooling fluid 204. Accordingly, the cooling fluid 204 may flow through the heat dissipation structure 80, including penetrating through the pores of the porous layer 86, for conducting heat away from the enlarged surface area created by the porous layer 86. The heat dissipation structure 80 and the heat dissipation system 200 may therefore effectively dissipate heat generated by the semiconductor devices 60A and 60B. In some embodiments, the heat dissipation system 200 also includes a motor 206 configured to circulate the cooling fluid 204 and create convections of the cooling fluid, which may further increase the efficiency that the cooling fluid 204 flowing through the pores of the porous layer 86 and may therefore reduce or avoid film boiling occurring on the heat dissipation structure 80. In some embodiments, the heat dissipation system 200 also includes a condenser 210 for collecting vapors of the cooling fluid 204 and transferring them back to a liquid state. Electrical connections (not shown) and other elements (e.g., piping, etc.) (not shown) may also be present.

FIGS. 14 to 17 are cross-sectional views of intermediate stages in the manufacturing of a semiconductor package 300 in accordance with some embodiments. The semiconductor package 300 may be similar to the semiconductor package 100, where like reference numerals refer to like elements. In some embodiments, the semiconductor package 300 is a package with a redistribution structure 302 formed over the encapsulant 70 for providing the semiconductor package 300 a compact size.

Figure 14:
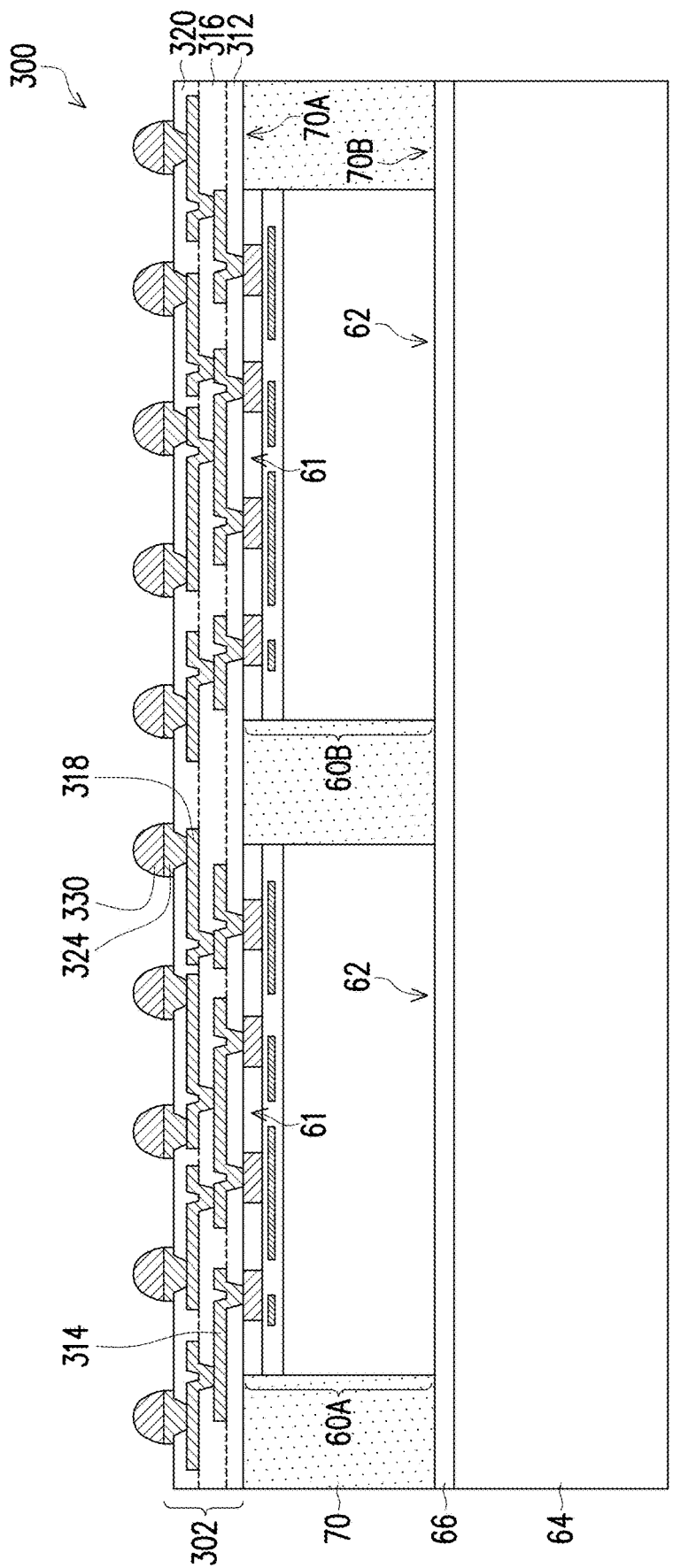
FIGS. 14-17 are cross-sectional views of intermediate stages in the manufacturing of a semiconductor package, in accordance with some embodiments.
Figure 15:
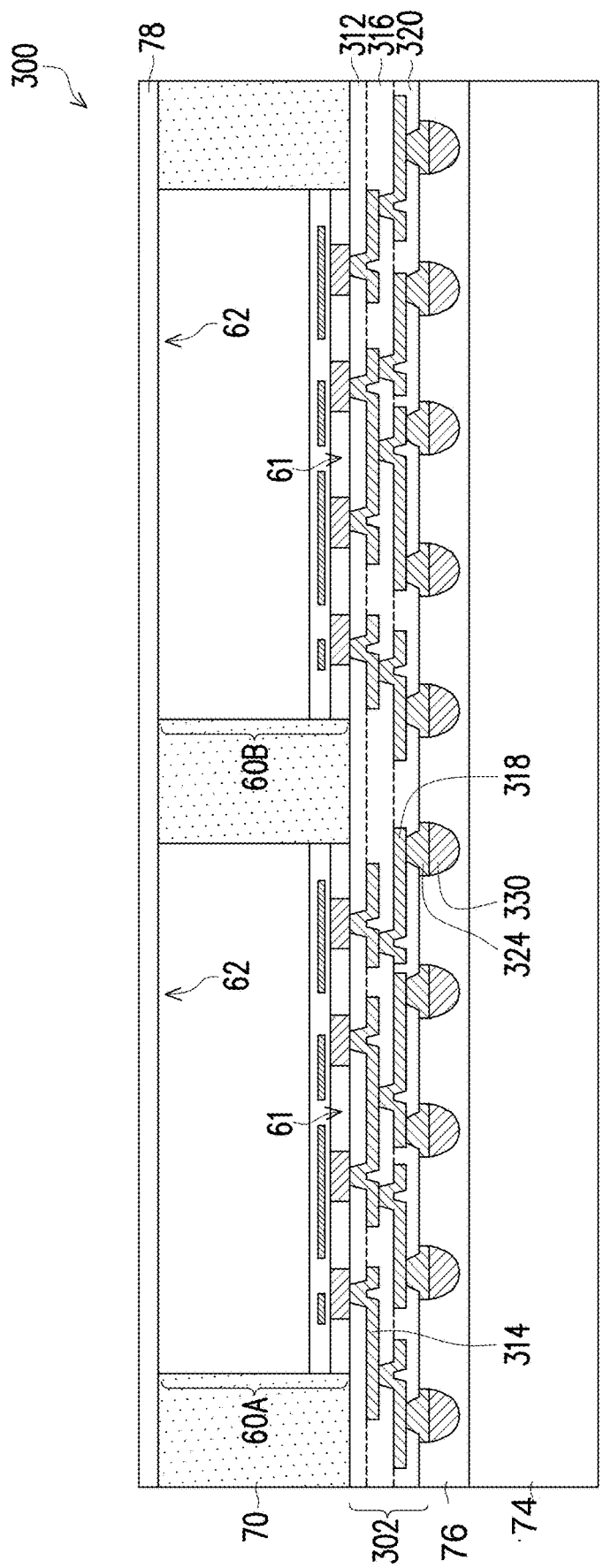

The manufacturing of the semiconductor package 300 is similar as those of the semiconductor package 100. For example, the processing of manufacturing the semiconductor package 300 as illustrated in FIG. 14 assumes the processing illustrated in FIGS. 2 to 4 performed prior. Accordingly, after the processing discussed above with reference to FIGS. 2 to 4, processing may proceed to FIG. 14. Referring to FIG. 14, a redistribution structure 302 is formed over the active sides 61 of the semiconductor devices 60A and 60B and the first side 70A of the encapsulant 70 in accordance with some embodiments. In some embodiments, the redistribution structure 302 may include dielectric layers 312, 316, and 320; and metallization patterns 314 and 318. The metallization patterns may also be referred to as redistribution layers or redistribution lines. The redistribution structure 302 is shown as an example having two layers of metallization patterns 314 and 318. However, more or fewer dielectric layers and metallization patterns may be formed.

In some embodiments, for forming the redistribution structure 302, the dielectric layer 312 is formed over the semiconductor devices 60A and 60B and the first side 70A of the encapsulant 70. The dielectric layer 312 may be formed by spin coating, lamination, CVD, the like, or a combination thereof. The dielectric layer 312 may be formed of a photo-sensitive material such as PBO, polyimide, BCB, or the like, which may be patterned using a lithography mask. The patterning forms openings exposing conductive features of the semiconductor devices 60A and 60B. The patterning may be by an acceptable process, such as by exposing and developing the dielectric layer 312 to light when the dielectric layer 312 is a photo-sensitive material or by etching using, for example, an anisotropic etch.

The metallization pattern 314 is then formed. The metallization pattern 314 includes conductive elements extending along the major surface of the dielectric layer 312 and extending through the dielectric layer 312 to physically and electrically couple the semiconductor devices 60A and 60B. As an example to form the metallization pattern 314, a seed layer (not shown) is formed over the dielectric layer 312 and in the openings extending through the dielectric layer 312. In some embodiments, the seed layer may be a single layer or a composite layer comprising a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed and may be exposed to light for patterning. The pattern of the photoresist corresponds to the metallization pattern 314. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 314. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as wet or dry etching.

The dielectric layer 316, the metallization pattern 318, and may be formed on the dielectric layer 312 and the metallization pattern 314 in a similar manner, and may be formed of a similar material as the dielectric layer 312 and the metallization pattern 314, respectively. The dielectric layer 320 is formed on the metallization pattern 318 and dielectric layer 316. The dielectric layer 320 may be formed in a manner similar to the dielectric layer 312, and may be formed of the same material as the dielectric layer 312. UBMs 324 are formed for external connections. The UBMs 324 have bump portions on and extending along the major surface of the dielectric layer 320, and have via portions extending through the dielectric layer 320 to physically and electrically couple the metallization pattern 318. As a result, the UBMs 324 are electrically coupled to the semiconductor devices 60. The UBMs 324 may include a same material as the metallization pattern 314.

Conductive connectors 330 are formed on the UBMs 324 of the redistribution structure 302. The conductive connectors 330 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 330 may include a conductive material such as solder, copper, aluminum, gold, nickel, silver, palladium, tin, lead, the like, or a combination thereof. In some embodiments, the conductive connectors 330 include the same materials as those of the conductive connectors 72 or 96 and are formed in a similar manner as the conductive connectors 72 or 96.

Figure 16:
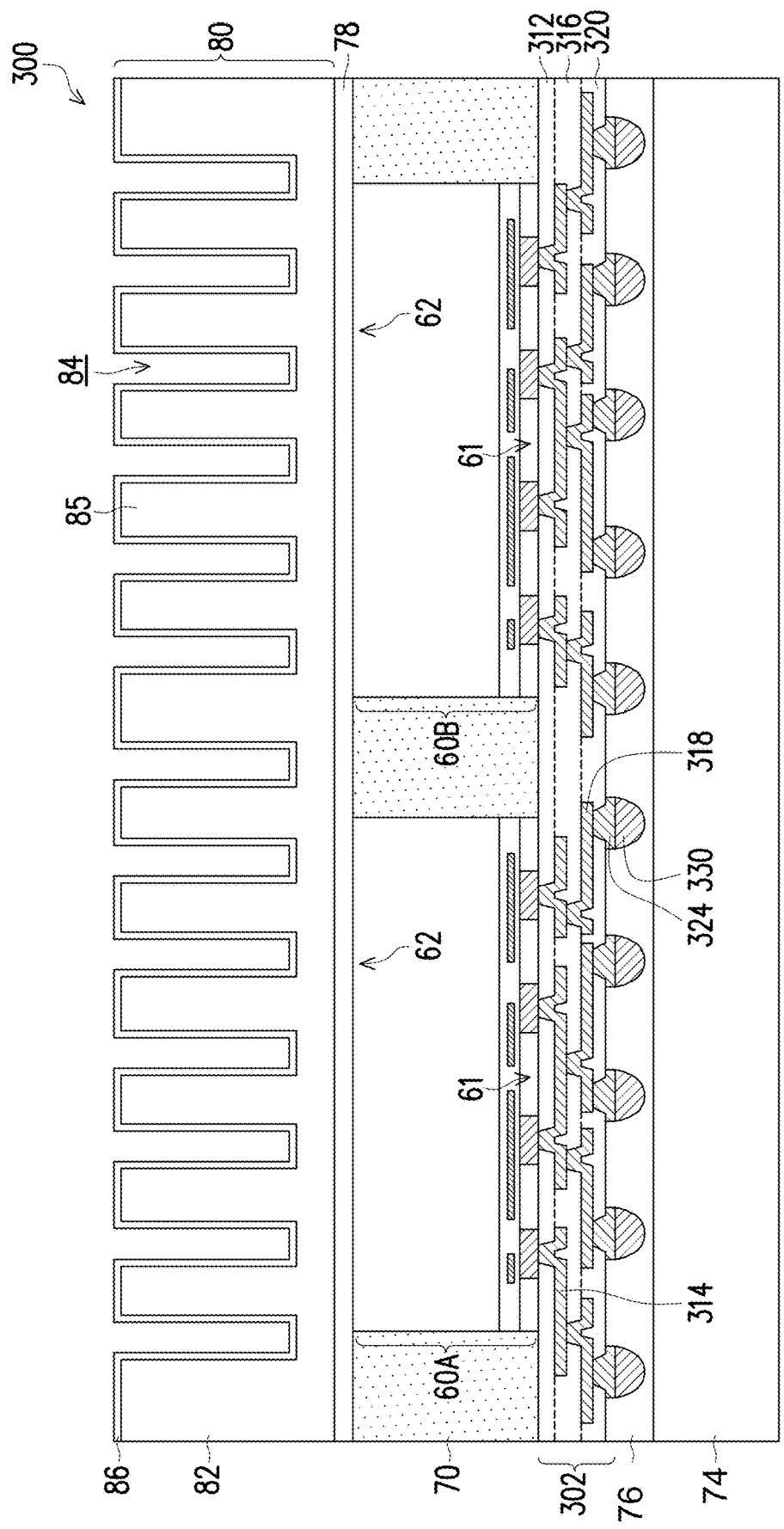
Figure 17:
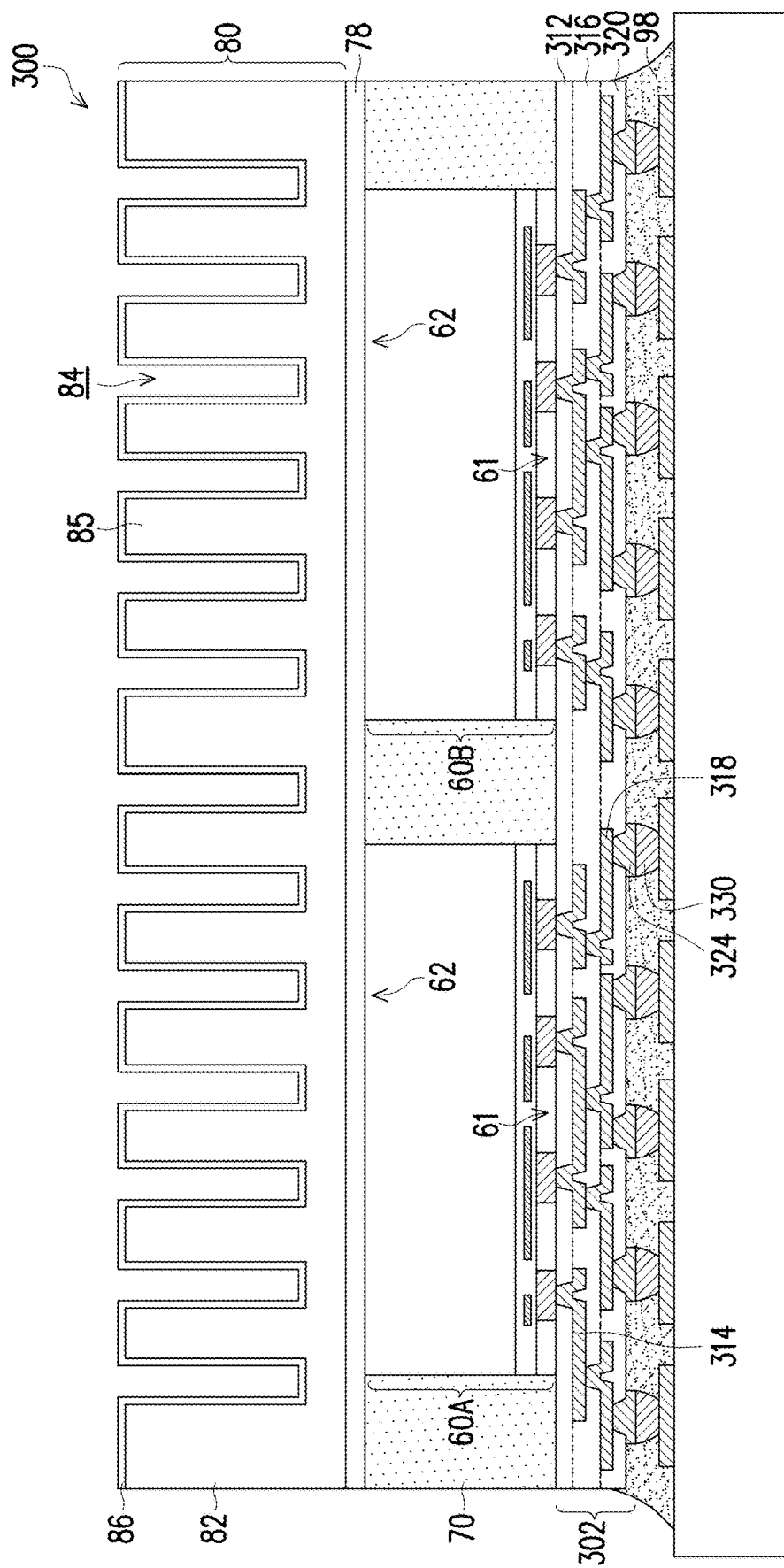

After the redistribution structure 302 and the conductive connectors 330 are formed, processing similar to those as illustrated in FIGS. 8 to 11 is performed. For example, in FIG. 15, the carrier substrate 74 is attached to the redistribution structure 302 and the conductive connectors 330 through the release layer 76, and the bonding film 78 is formed over the inactive sides 62 of the semiconductor devices 60A and 60B and the second side 70B of the encapsulant 70, using processes and/or materials as described with reference to FIG. 8. In FIG. 16, the heat dissipation structure 80 is attached to or formed over the bonding film 78, using processes and/or materials as described with reference to FIG. 9. In some embodiments, the substrate 88 is omitted, and the conductive connectors 330 are attached to the substrate 94 directly after the detachment of the carrier substrate. The underfill 98 is then formed between the redistribution structure 302 and the substrate 94, surrounding the conductive connectors 330. An exemplary resulting structure is illustrated in FIG. 17. The redistribution structure 302 may be formed in a wafer level. Thus, after the singulation process as illustrated in FIG. 11, the semiconductor package 300 as illustrated in FIG. 17 is one of the singulated semiconductor packages. As a result of the singulation process, the outer sidewalls of the redistribution structure 302 and the encapsulant 70 are laterally coterminous (within process variations). In some embodiments, the heat dissipation structure 80 provides the semiconductor package 300 with improved heat dissipation efficiency and capacity. The semiconductor package 300 is able to be operated in the heat dissipation system 20.

Figure 18:
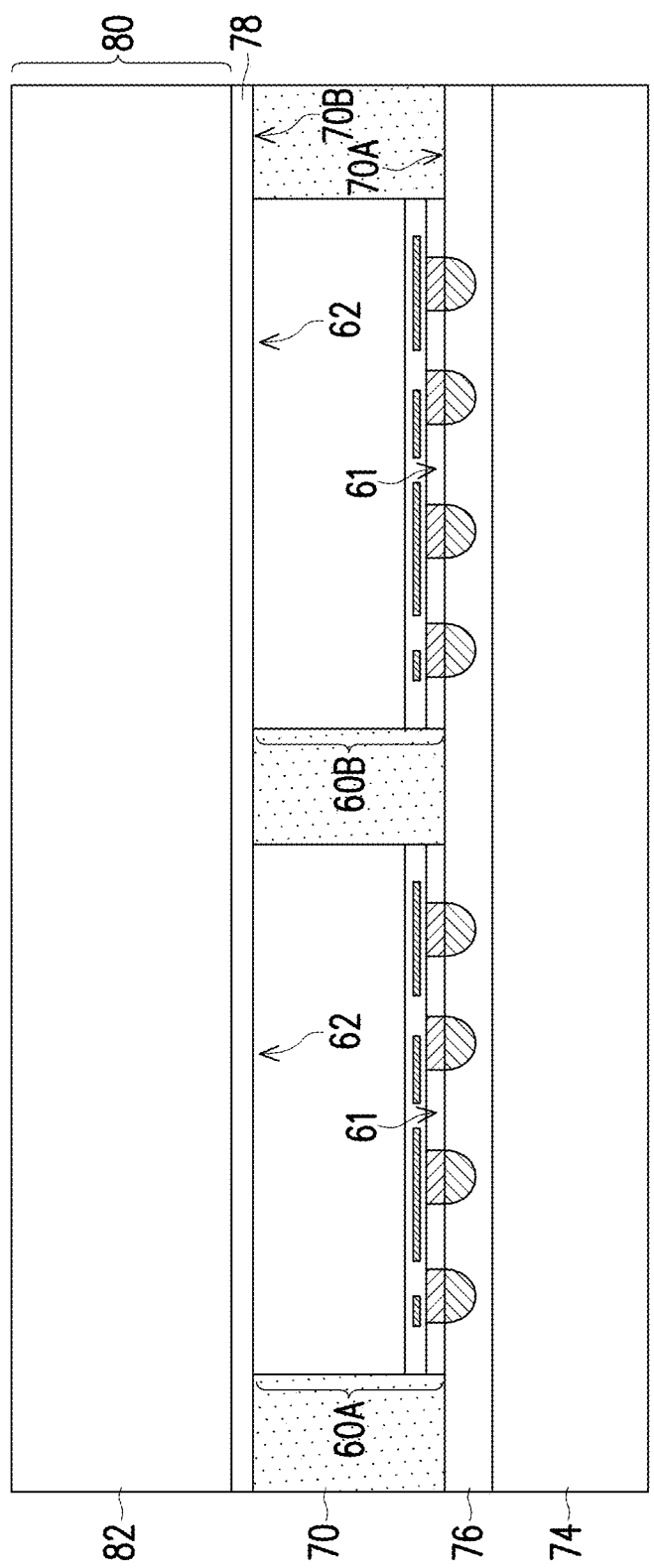
Figure 19:
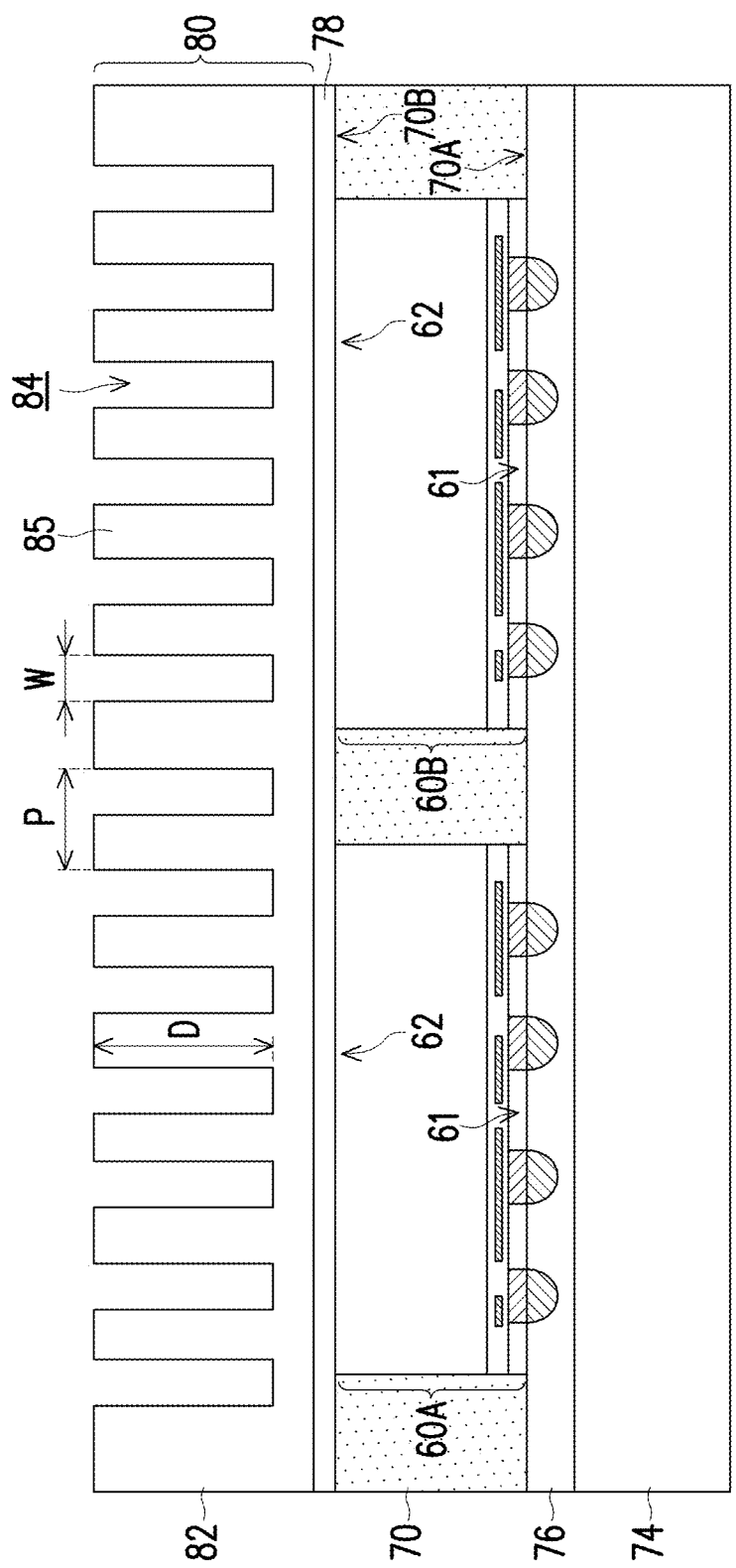
Figures 20A, 20B:
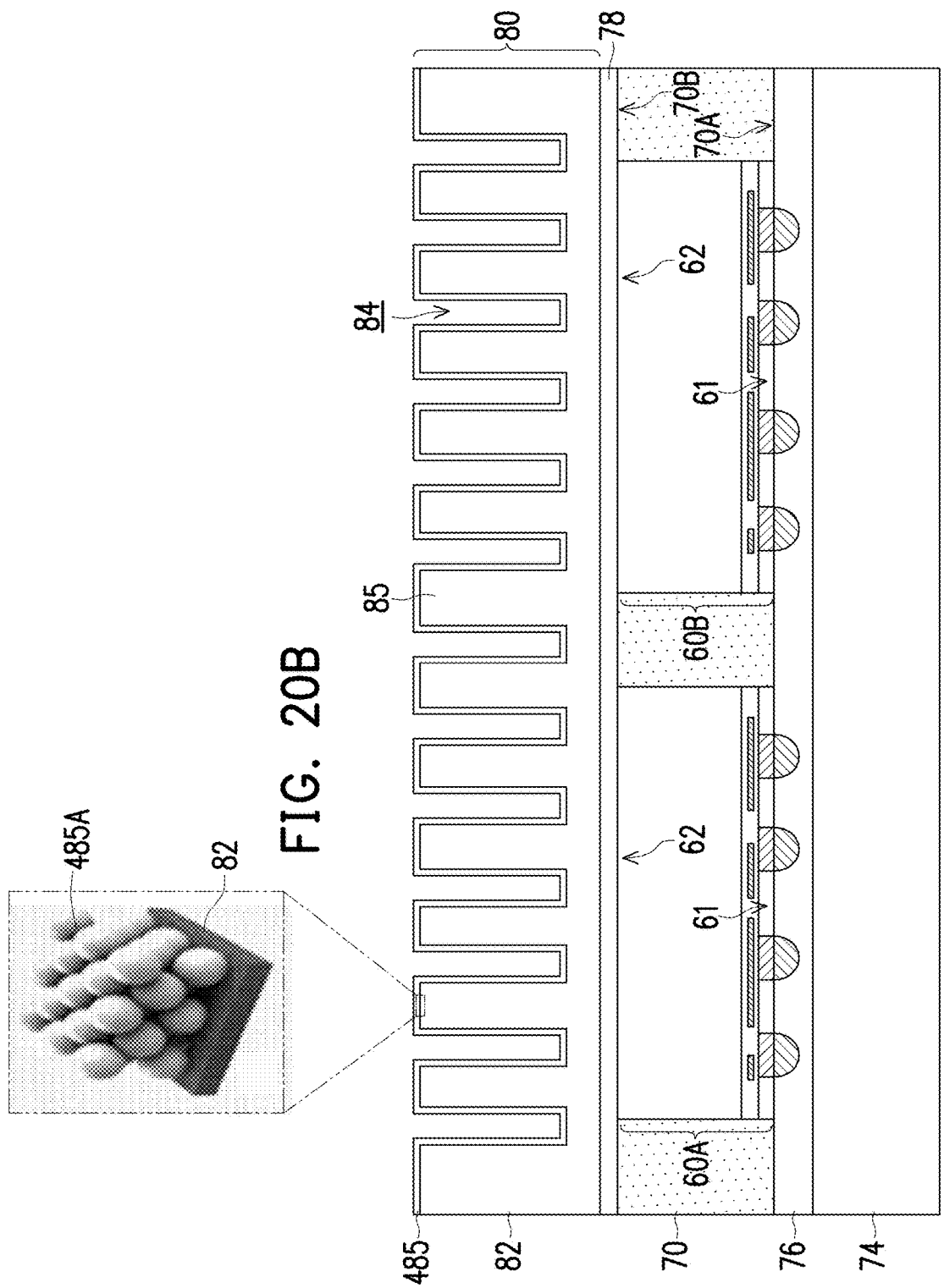
Figures 21A, 21B:
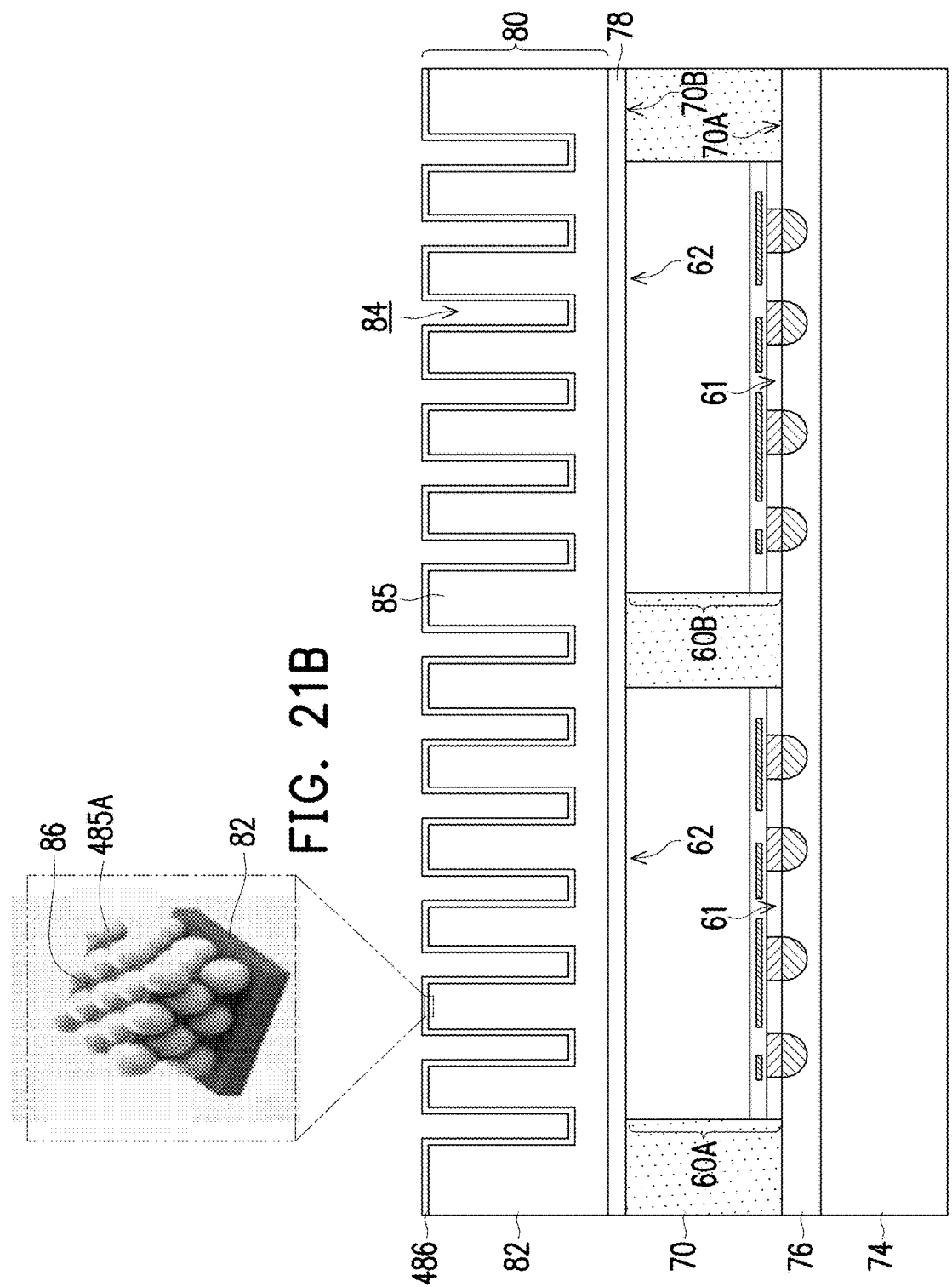

FIGS. 18, 19, 20A, 21A, and 22A illustrate cross-sectional views of intermediate stages in processes of manufacturing the heat dissipation structure 80 in accordance with some embodiments, where FIGS. 20B, 21B, and 22B illustrate enlarged views of a polymer layer or the porous layer 86 in FIGS. 20A, 21A, and 21A, respectively. The manufacturing processes illustrated in FIGS. 18 to 22B illustrate forming the heat dissipation structure 80 over the intermediate structure (e.g., the semiconductor package 100, the semiconductor package 300, or the like); however, the heat dissipation structure 80 can be manufactured independently from and attached to the semiconductor package 100.

In FIG. 18, the substrate 82 in a bulk state is attached to the bonding film 78 of an intermediate structure of the semiconductor package 100 as illustrated in FIG. 7 in accordance with some embodiments. The semiconductor package 100 is used for illustrative purposes and may be substituted for other components, such as the semiconductor package 300. In FIG. 19, the trenches 84 are recessed from a top surface of the substrate 82. The trenches 84 may be formed by a milling process, an etching process, laser techniques, a combination thereof, or the like. In some embodiments, referring to FIG. 19, each of the trenches 84 may have a width W ranging from 2 µm to 3000 µm and a depth D ranging from 1 µm to 1000 µm. Adjacent trenches 84 may have a pitch P ranging from 20 µm to 5000 µm.

Referring to FIG. 20A, a polymer layer 485 is formed over the top surface of the substrate 82 and over the surfaces of the trenches 84. For example, the polymer layer 485 may be formed by a dip coating process, a sol-gel dip coating process, or other suitable coating or deposition process. For example, microparticles or nanoparticles (collectively referred to as microparticles 485A), such as microspheres or particles in other shapes may be carried by a solvent or formed by a sol-gel process in a solvent. The substrate 82 and pillars 85 may then be dipped into the solvent with the microparticles 485A and removed. When removed, the microparticles 485A remain on the substrate 82 and the pillars 85. Remaining solvent on the substrate 82 and pillars 85 is removed during a drying process, thereby leaving the microparticles 485A as illustrated in FIGS. 20A and 20B, wherein the microparticles 485A are collectively referred to as the polymer layer 485. In some embodiments, the microparticles 485A have an average particle size of about 0.1 µm to about 5 µm.

In some embodiments the polymer layer 485 is conformal to the pillars 85 of the substrate 82. Referring to FIG. 20B, the polymer layer 485 may have a loose structure aggregated by the microparticles 485A. As such, the polymer layer 485 may include spaces or channels between adjacent ones of the microparticles 485A and can function as a template for subsequently forming a porous layer (see, e.g., the porous layer 86 of FIGS. 22A and 22B). In some embodiments, the polymer layer 485 includes polystyrene, polyethylene, polyethylene glycol, polyacrylate, polyoxyalkylene, polyacrylate, polyurethane, polyacrylamide, or a copolymer including polymers thereof, or combinations thereof, or the like. In some embodiments, the polymer layer 485 may be sintered. The sintering may partially melt the microparticles 485A of the polymer layer 485 so that the channels between pores in the porous layer 86 may be enlarged. For example, the polymer layer 485 may be sintered in 80 to 200 degrees for 0.1 hours to 10 hours.

Referring to FIGS. 21A and 21B, a layer 486 is formed over the polymer layer 485. The layer 486 may be formed over the surfaces of the microparticles 485A, filling or partially filling the spaces or channels between adjacent ones of the microparticles 485A. The layer 486 may be formed by electroplating, electroless plating, CVD, or the like. In some embodiments in which electroplating is used, a seed layer may be deposited by atomic layer deposition (ALD) or PVD first, and a plated metallic material is formed over the seed layer. In some embodiments, the seed layer may be a single layer or a composite layer comprising a plurality of sub-layers formed of different materials. In some embodiments, the seed layer includes a titanium layer and a copper layer over the titanium layer. In such embodiment, the combination of the plated metallic material (e.g., copper) and the underlying seed layer form the material of the porous layer 86.

Next, referring to FIGS. 22A and 22B, the polymer layer 485 is removed, leaving the porous layer 86 over the surfaces of the trenches 84 and the pillars 85, in accordance with some embodiments. The polymer layer 485 may be removed by annealing, oxygen plasma, or an organic solvent. In some embodiments, the organic solvent is an organic solvent that can selectively dissolve the polymer layer 485, such as methanol, ethanol, propanol, isopropanol, isobutyl alcohol, diethyl ester, methyl ethyl ether, ethyl acetate, hexane, cyclohexane, chloroform, acetone, benzene, toluene, combinations thereof, or the like. As such, the polymer layer 485 may be extracted away with the organic solvent, leaving the porous layer 86.

Figure 23:
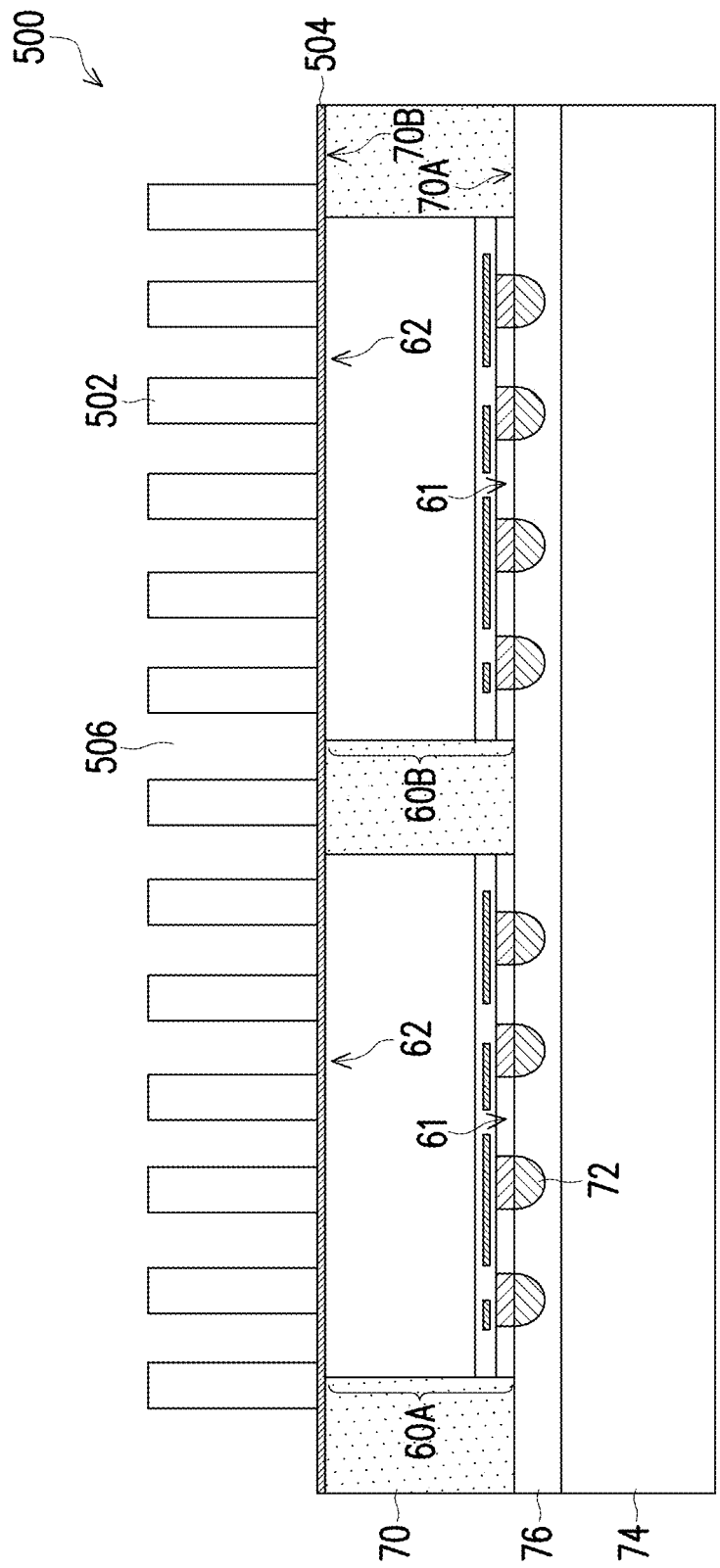
FIGS. 23-27 are cross-sectional views of intermediate stages in the manufacturing of a semiconductor package, in accordance with some embodiments.
Figure 24:
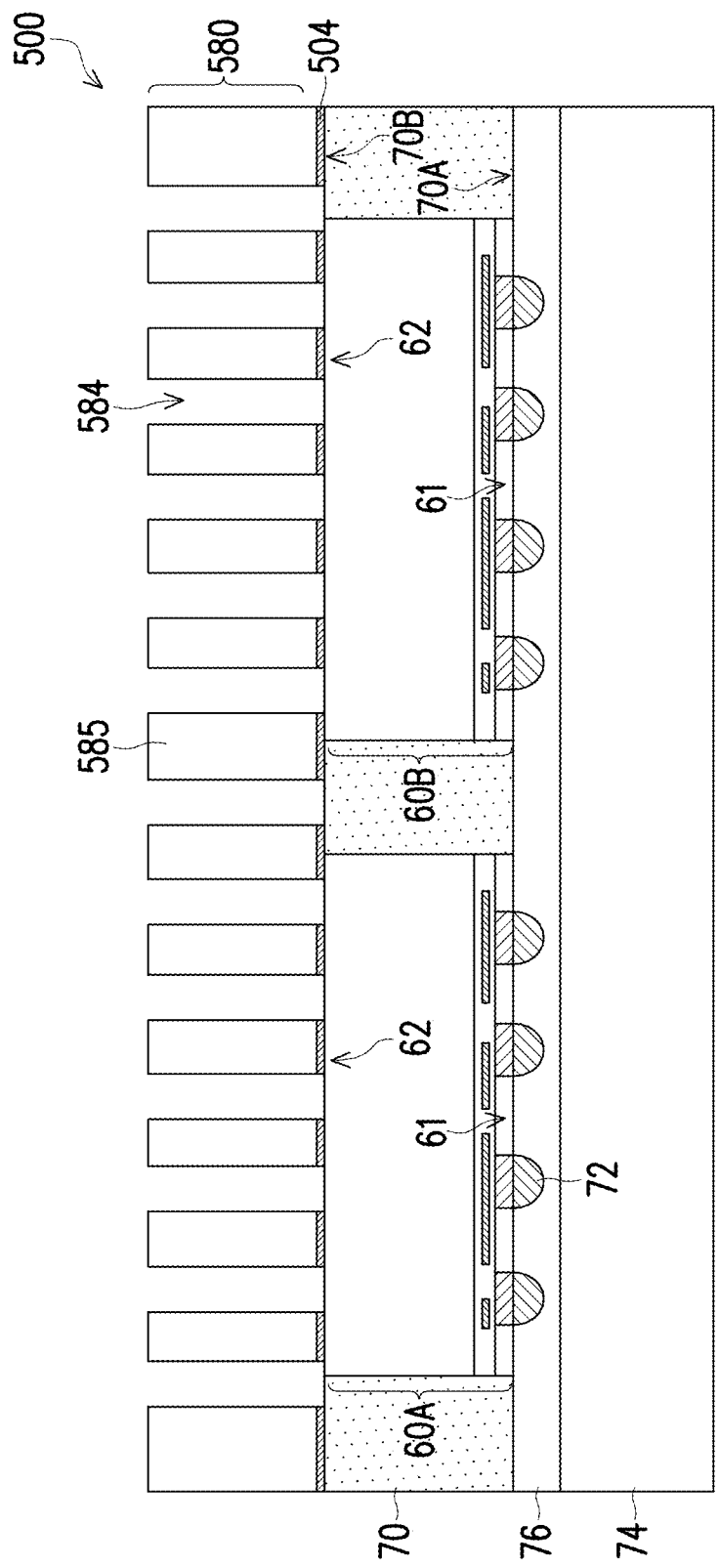
Figure 25:
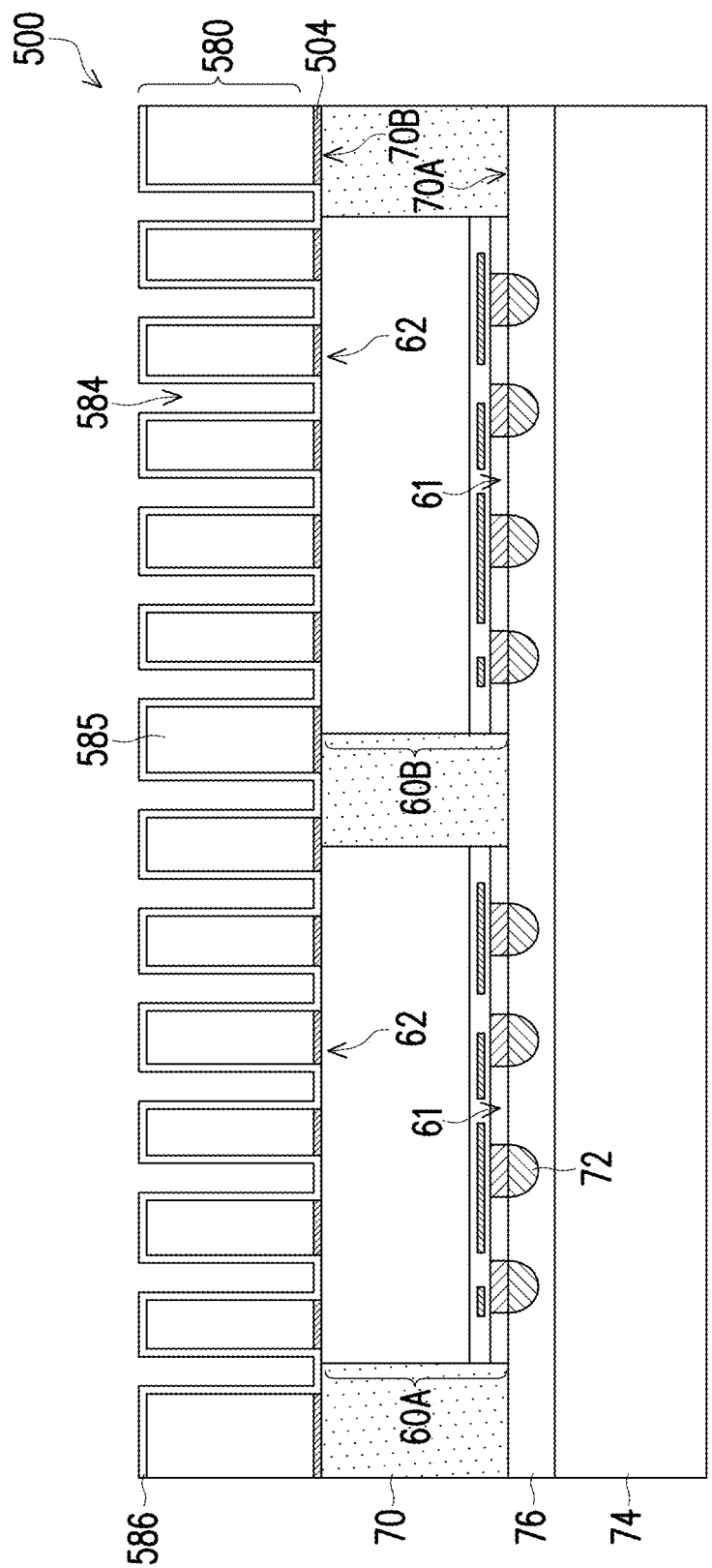

FIGS. 23 to 25 illustrate cross-sectional views of intermediate stages in the manufacturing of a semiconductor package 500 in accordance with some embodiments. The semiconductor package 500 may be similar to the semiconductor package 100, with a heat dissipation structure 580, where like reference numerals refer to like elements. The manufacturing of the semiconductor package 500 is similar as those of the semiconductor package 100. For example, processing of manufacturing the semiconductor package 500 as illustrated in FIG. 23 assumes the processing illustrated in FIGS. 2 to 7 performed prior. Accordingly, after the processing discussed above with reference to FIGS. 2 to 7, processing may proceed to FIG. 23.

Referring to FIG. 23, a patterned mask 502 is formed over the active sides 61 of the semiconductor devices 60A and 60B and the first side 70A of the encapsulant 70 in accordance with some embodiments. A seed layer 504 may be optionally formed before the patterned mask 502 and the patterned mask 502 may be formed over the seed layer 504, if an electroplating process is used in subsequent processes. The seed layer 504 may be a single layer or a composite layer comprising a plurality of sub-layers formed of different materials, such as a titanium layer and a copper layer over the titanium layer. The patterned mask 502 may include openings 506 corresponding to the shape of subsequently formed pillars. In some embodiments, the patterned mask 502 includes a photoresist material. The photoresist material may be patterned by a lithography process. In some embodiments, the patterned mask 502 may include a pattern similar to the pattern of trenches 84 illustrated in FIGS. 9B and 9C.

In FIG. 24, a plurality of pillars 585 is formed in the openings 506 (see FIG. 23) of the patterned mask 502 in accordance with some embodiments. In some embodiments, the pillars 585 include materials similar to those of the substrate 82. The pillars 585 may be formed by electroplating, electroless plating, CVD, PVD, or a combination thereof. In some embodiments in which the pillars 585 are formed by electroplating, a plated metallic material (e.g., copper) is deposited over exposed portions of the seed layer 504. The seed layer 504 and the plated metallic material over the seed layer 504 may form the pillars 585. In some embodiments in which the conductive pillars are formed by a deposition process like CVD or PVD, the seed layer 504 may be omitted. The patterned mask 502 and exposed portions of the seed layer 504 (if present) may be removed after the pillars 585 are formed, leaving the trenches 584 formed between the pillars 585. The trenches 584 may extend through the pillars 585 (including the seed layer 504 if present) and expose the inactive sides 62 of the semiconductor devices 60A and 60B and the first side 70A of the encapsulant 70. The patterned mask 502 and the exposed portions of the seed layer 504 (if present) may be removed by dry etching or wet etching.

Figure 26:
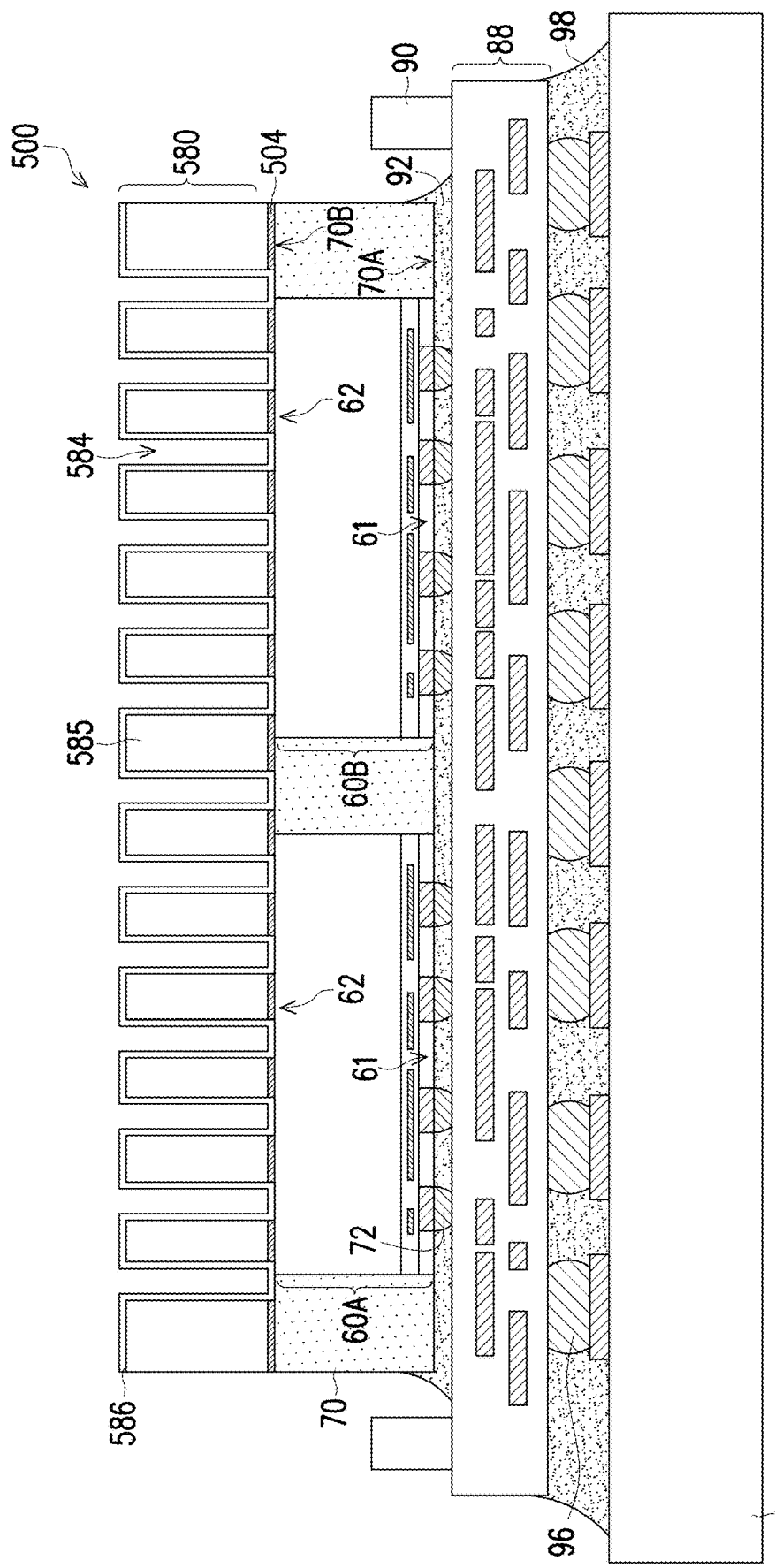
Figure 27:
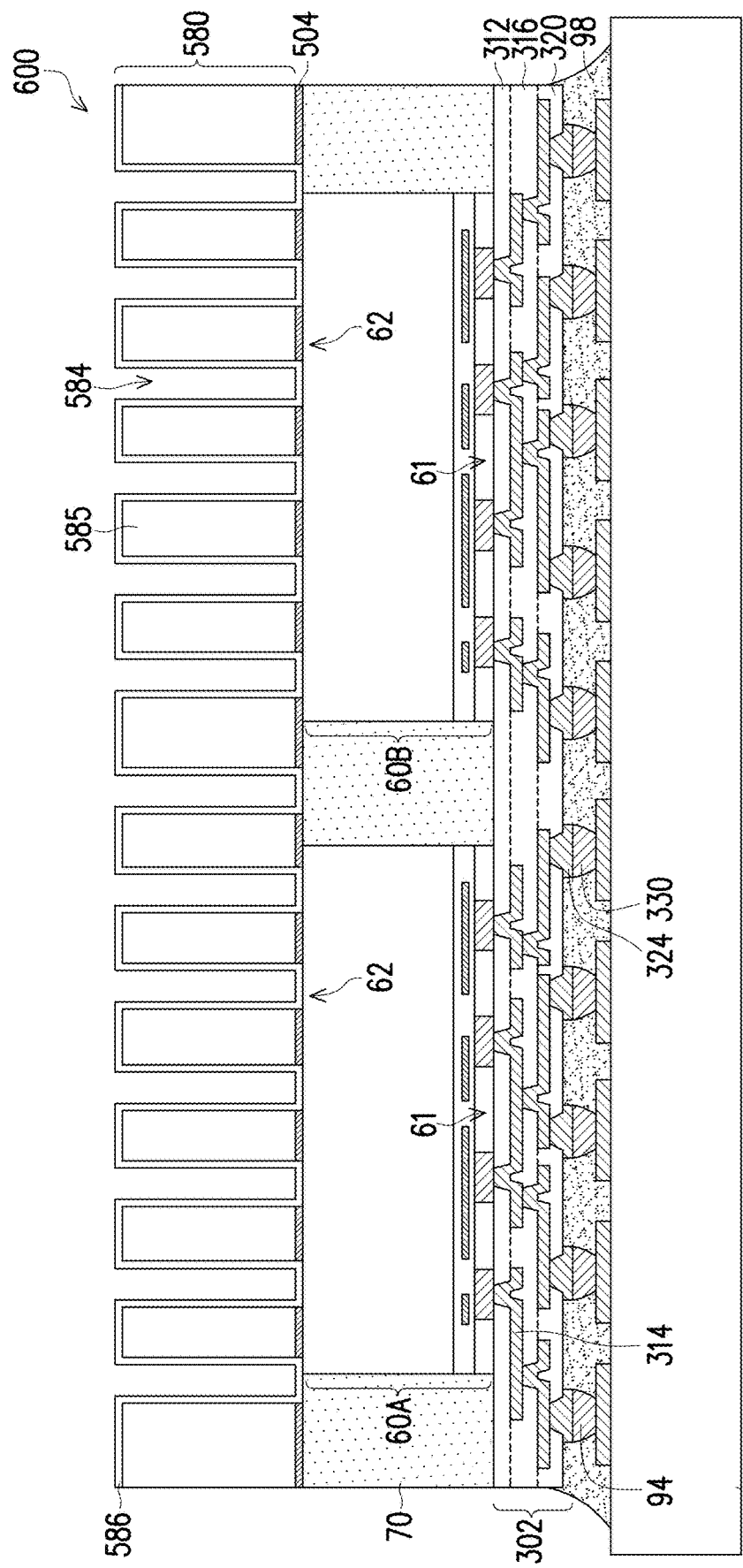

Next, in FIG. 25, a porous layer 586 is formed along surfaces of the pillars 585 and the trenches 584, thereby forming the heat dissipation structure 580. The porous layer 586 may be in contact with the inactive sides 62 of the semiconductor devices 60A and 60B and the first side 70A of the encapsulant 70. The porous layer 586 may include a material similar to those of the porous layer 86 and may be formed in a similar manner. Next, manufacturing of the semiconductor package 500 may proceed with performing processes similar to those illustrated in FIGS. 10 to 12 for the semiconductor package 100, and a resulting structure of the semiconductor package 500 is illustrated in FIG. 26. In some embodiments, the processes of manufacturing the heat dissipation structure 580 may be integrated into the processes of manufacturing the semiconductor package 300, and a resulting structure of a semiconductor package 600 is illustrated in FIG. 27.

A semiconductor package with improved heat dissipation efficiency and capacity is provided in accordance with some embodiments. In some embodiments, the package includes a heat dissipation structure disposed over a semiconductor device and an encapsulant around the semiconductor device. The heat dissipation structure includes a plurality of trenches and a porous layer extending along the trenches so that the heat dissipation structure may provide an increased surface area that allows cooling fluid to contact. Thus, the heat dissipation efficiency and capacity of the semiconductor package are improved, and the performance of the semiconductor package is also improved. In some embodiments, a heat dissipation system for allowing the semiconductor package to be operated therein is also provided. The semiconductor package may also be designed to be operated in liquid, such as being immersed and operated in a cooling fluid contained in the heat dissipation system.

In an embodiment, a package includes a semiconductor device; an encapsulant laterally surrounding the semiconductor device; and a heat dissipation structure disposed over the semiconductor device and the encapsulant, wherein the heat dissipation structure includes a plurality of pillars and a porous layer extending over sidewalls of the plurality of pillars. In an embodiment, the porous layer includes Cu, Al, Ni, Co, Ti, W, Si, or a combination thereof. In an embodiment, the plurality of pillars includes Cu, Al, Ni, Co, Ti, W, Si, graphite, graphene, or a combination thereof. In an embodiment, the porous layer and the plurality of pillars are a same material. In an embodiment, the porous layer includes a pore size of 0.1 µm to 5 µm. In an embodiment, the package further includes a bonding film disposed between the semiconductor device and the heat dissipation structure and between the encapsulant and the heat dissipation structure. In an embodiment, the bonding film is an oxide layer and overlaps the encapsulant in a plan view. In an embodiment, the semiconductor device is in physical contact with the porous layer. In an embodiment, the plurality of pillars is attached to the semiconductor device and the encapsulant through a bonding film, wherein the bonding film includes an oxide layer. In an embodiment, the plurality of pillars includes a seed layer in physical contact with the semiconductor device.

In an embodiment, a package includes a semiconductor device including a first surface; an encapsulant disposed adjacent to the semiconductor device, the encapsulant including a second surface coplanar with the first surface of the semiconductor device; and a heat dissipation structure attached to the first surface of the semiconductor device and the second surface of the encapsulant, wherein the heat dissipation structure includes a plurality of pillars and a porous layer extending over the pillars. In an embodiment, the package further includes a redistribution structure disposed over a third surface of the semiconductor device opposite to the first surface of the semiconductor device, wherein the redistribution structure extends over a fourth surface of the encapsulant opposite to the second surface of the encapsulant, wherein the redistribution structure includes a dielectric layer in physical contact with the semiconductor device. In an embodiment, a sidewall of the heat dissipation structure and a sidewall of the redistribution structure are laterally coterminous. In an embodiment, the porous layer is in physical contact with the first surface of the semiconductor device and the first surface of the encapsulant. In an embodiment, the porous layer and the pillars are formed of a same material.

In an embodiment, a method of forming a package includes forming an encapsulant laterally surrounding a semiconductor device; and disposing a heat dissipation structure over the semiconductor device and the encapsulant, wherein the heat dissipation structure comprises a plurality of pillars, a plurality of trenches, and a porous layer extending along sidewalls and top surfaces of the pillars. In an embodiment, the method further includes after disposing the heat dissipation structure, singulating the encapsulant and the heat dissipation structure. In an embodiment, disposing the heat dissipation structure includes: forming a bonding film over the semiconductor device and the encapsulant; attaching a substrate to the bonding film; after attaching the substrate to the bonding film, forming the plurality of trenches in the substrate, thereby forming the plurality of pillars between adjacent ones of the plurality of trenches; and forming the porous layer over the sidewalls and the top surfaces of the pillars. In an embodiment, disposing the heat dissipation structure comprises: forming the heat dissipation structure; and after forming the heat dissipation structure, attaching the heat dissipation structure to the semiconductor device and the encapsulant. In an embodiment, disposing the heat dissipation structure comprises: forming a seed layer over the semiconductor device and the encapsulant; forming a mask layer over the seed layer, wherein the mask layer comprises a plurality of openings exposing portions of the seed layer; forming a conductive material over exposed portions of the seed layer, wherein the conductive material and the seed layer form the plurality of pillars; removing the mask layer and portions of the seed layer not covered by the conductive material; and forming the porous layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a semiconductor device;
   an encapsulant laterally surrounding the semiconductor device;
   a heat dissipation structure disposed over the semiconductor device and the encapsulant, wherein the heat dissipation structure comprises a plurality of pillars and a porous layer extending over sidewalls of the plurality of pillars; and
   an oxide bonding film between the heat dissipation structure and the semiconductor device and between the heat dissipation structure and the encapsulant, wherein the oxide bonding film forms a first bonding interface between the heat dissipation structure and the semiconductor device and forms a second bonding interface between the heat dissipation structure and the encapsulant that extends to a periphery of the encapsulant.

2. The package of claim 1, wherein the porous layer comprises Cu, Al, Ni, Co, Ti, W, Si, or a combination thereof.

3. The package of claim 1, wherein the plurality of pillars comprises Cu, Al, Ni, Co, Ti, W, Si, graphite, graphene, or a combination thereof.

4. The package of claim 1, wherein the porous layer and the plurality of pillars are a same material.

5. The package of claim 1, wherein the porous layer comprises a pore size of 0.1 µm to 5 µm.

6. The package of claim 1, wherein the porous layer is in direct contact with the semiconductor device.

7. The package of claim 1, wherein the pillars are separated by trenches, the trenches extending partially but not fully through the heat dissipation structure.

8. The package of claim 1, wherein the semiconductor device is in physical contact with the porous layer.

9. The package of claim 1, wherein the plurality of pillars is attached to the semiconductor device and the encapsulant through a bonding film, wherein the bonding film comprises an oxide layer.

10. The package of claim 1, wherein the plurality of pillars comprises a seed layer in physical contact with the semiconductor device.

11. A package, comprising:
    a semiconductor device comprising a first surface;
    an encapsulant disposed adjacent to the semiconductor device, the encapsulant comprising a second surface; and
    a heat dissipation structure attached to the first surface of the semiconductor device and the second surface of the encapsulant, wherein the heat dissipation structure comprises a plurality of pillars and a porous layer extending over the pillars, wherein the porous layer is in direct physical contact with the first surface of the semiconductor device and the second surface of the encapsulant.

12. The package of claim 11, further comprising a redistribution structure disposed over a third surface of the semiconductor device opposite to the first surface of the semiconductor device, wherein the redistribution structure extends over a fourth surface of the encapsulant opposite to the second surface of the encapsulant, wherein the redistribution structure comprises a dielectric layer in physical contact with the semiconductor device.

13. The package of claim 12, wherein a sidewall of the heat dissipation structure and a sidewall of the redistribution structure are laterally coterminous.

14. The package of claim 11, wherein the porous layer is in physical contact with the first surface of the semiconductor device and the second surface of the encapsulant.

15. The package of claim 11, the porous layer and the pillars are formed of a same material.

16. A method of forming a package, the method comprising:
    forming an encapsulant laterally surrounding a semiconductor device; and
    disposing a heat dissipation structure over the semiconductor device and the encapsulant, wherein the heat dissipation structure comprises a plurality of pillars, and a plurality of trenches; wherein the method further includes
    coating the plurality of pillars and the plurality of trenches with a layer of microparticles,
    coating the layer of microparticles with a metallic material, and
    removing the layer of microparticles to form a porous layer extending along sidewalls and top surfaces of the pillars.

17. The method of claim 16, further comprising, after disposing the heat dissipation structure, singulating the encapsulant and the heat dissipation structure.

18. The method of claim 16, wherein disposing the heat dissipation structure comprises:
    forming a bonding film over the semiconductor device and the encapsulant;
    attaching a substrate to the bonding film; and
    after attaching the substrate to the bonding film, forming the plurality of trenches in the substrate, thereby forming the plurality of pillars between adjacent ones of the plurality of trenches.

19. The method of claim 16, wherein disposing the heat dissipation structure comprises:
    forming the heat dissipation structure; and
    after forming the heat dissipation structure, attaching the heat dissipation structure to the semiconductor device and the encapsulant.

20. The method of claim 16, wherein disposing the heat dissipation structure comprises:
    forming a seed layer over the semiconductor device and the encapsulant;
    forming a mask layer over the seed layer, wherein the mask layer comprises a plurality of openings exposing portions of the seed layer;
    forming a conductive material over exposed portions of the seed layer, wherein the conductive material and the seed layer form the plurality of pillars;
    removing the mask layer and portions of the seed layer not covered by the conductive material; and
    forming the porous layer.

* * * * *